(12) United States Patent
Fujita et al.

(10) Patent No.: US 7,952,208 B2
(45) Date of Patent: May 31, 2011

(54) SUBSTRATE, MANUFACTURING METHOD THEREOF, METHOD FOR MANUFACTURING SEMICONDUCTOR DEVICE

(75) Inventors: Toru Fujita, Tsuruoka (JP); Masanobu Shouji, Tsuruoka (JP)

(73) Assignee: Seiko Epson Corporation, Tokyo (JP)

( * ) Notice: Subject to any disclaimer, the term of this patent is extended or adjusted under 35 U.S.C. 154(b) by 243 days.

(21) Appl. No.: 12/409,226

(22) Filed: Mar. 23, 2009

(65) Prior Publication Data

US 2009/0243095 A1    Oct. 1, 2009

(30) Foreign Application Priority Data

Mar. 31, 2008  (JP) ................................. 2008-090467

(51) Int. Cl.
*H01L 23/498*    (2006.01)

(52) U.S. Cl. ................ 257/778; 257/737; 257/E23.068; 438/613

(58) Field of Classification Search ................... 257/676, 257/737, 738, 778, E21.499, E21.598, E23.068; 438/113, 613
See application file for complete search history.

(56) References Cited

U.S. PATENT DOCUMENTS

| | | | | |
|---|---|---|---|---|
| 5,847,458 A | * | 12/1998 | Nakamura et al. | 257/738 |
| 6,025,650 A | * | 2/2000 | Tsuji et al. | 257/786 |
| 6,498,392 B2 | * | 12/2002 | Azuma | 257/676 |
| 6,635,957 B2 | * | 10/2003 | Kwan et al. | 257/691 |
| 7,696,082 B2 | * | 4/2010 | Otsuki | 438/613 |

FOREIGN PATENT DOCUMENTS

| | | |
|---|---|---|
| JP | A-2-240940 | 9/1990 |
| JP | A-2004-281486 | 10/2004 |
| JP | A-2006-108343 | 4/2006 |

* cited by examiner

*Primary Examiner* — Roy K Potter
(74) *Attorney, Agent, or Firm* — Oliff & Berridge, PLC

(57) ABSTRACT

A substrate on which an IC element is fixed includes: a plurality of metal posts arranged in a plurality of columns in a lengthwise direction and in a plurality of rows in a crosswise direction when viewed in a plan view, the plurality of metal posts having first faces and second faces that face an opposite side to a side that the first faces face; first marks each of the first marks being disposed on extending lines of the plurality of columns; and second marks, each of the second marks being disposed on extending lines of the plurality of rows.

12 Claims, 28 Drawing Sheets

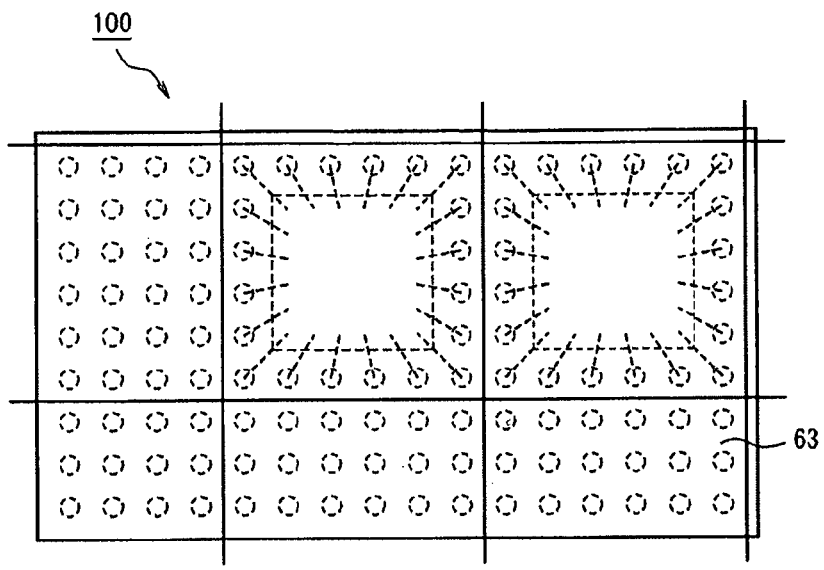
FIG.16A
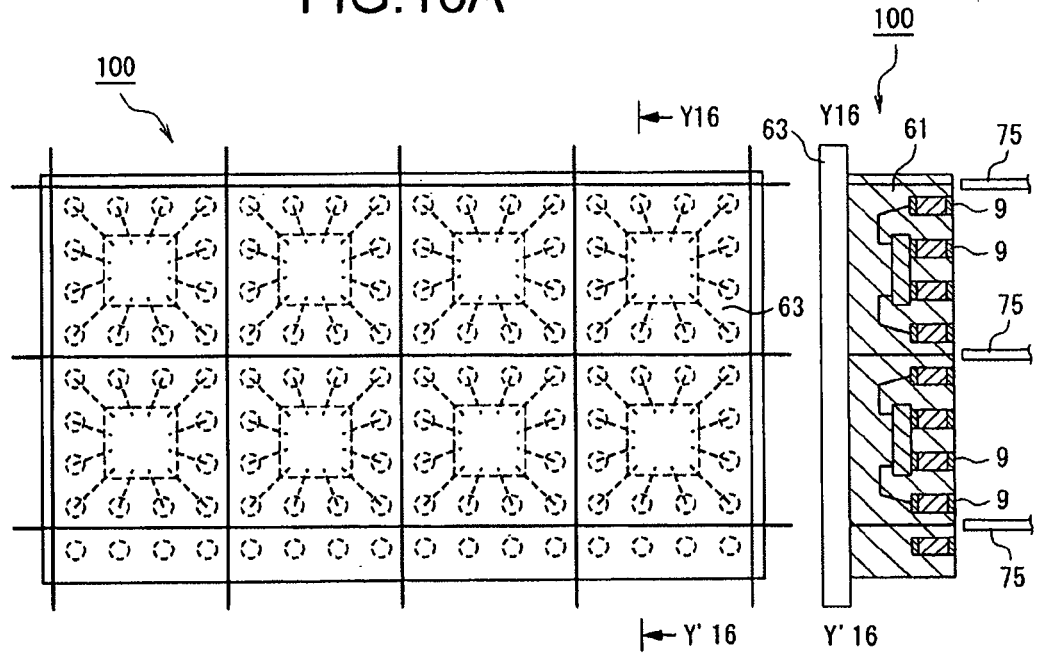
FIG.16B
FIG.16C

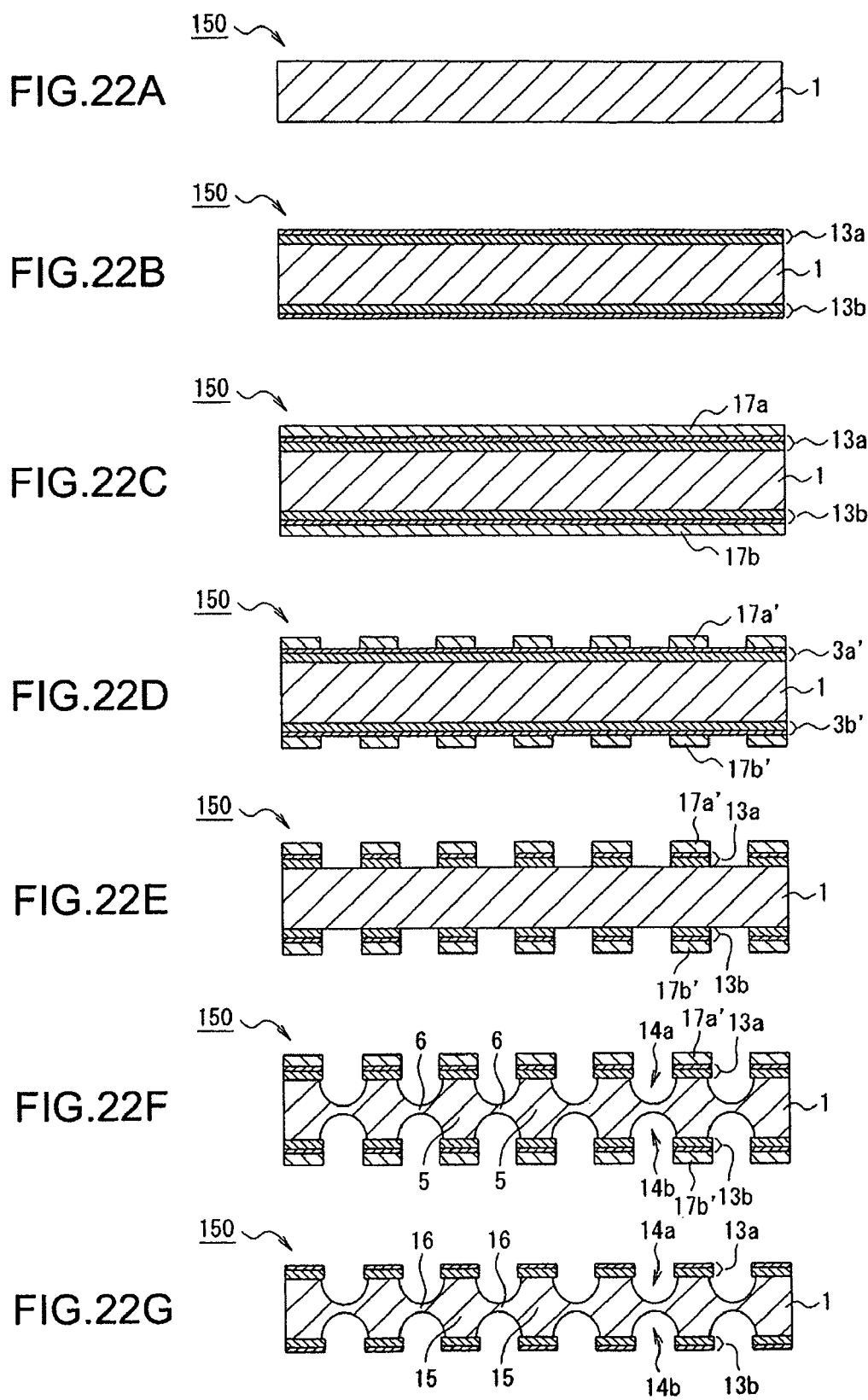

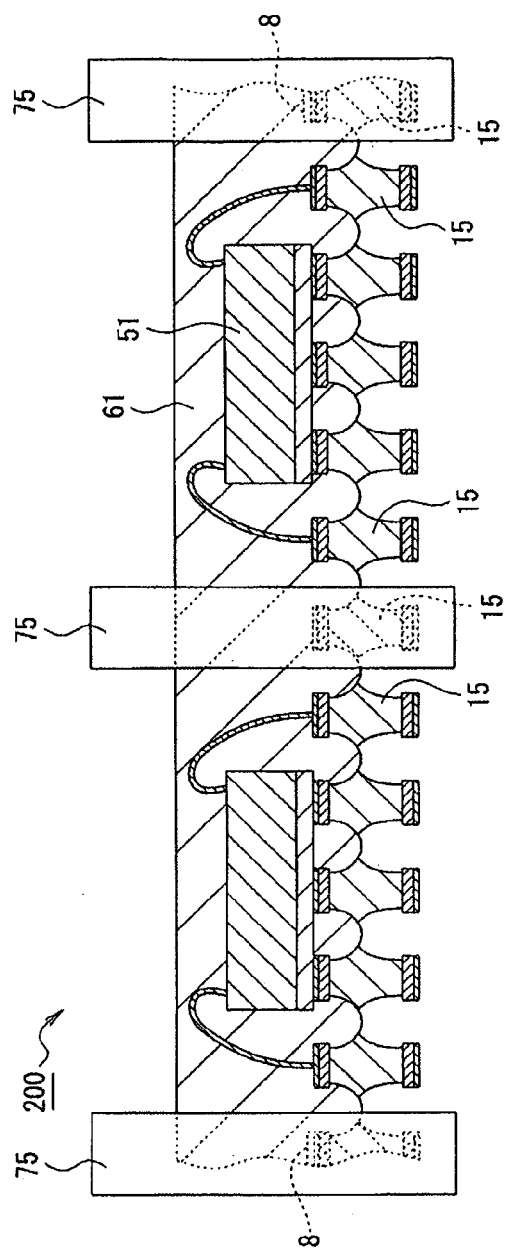
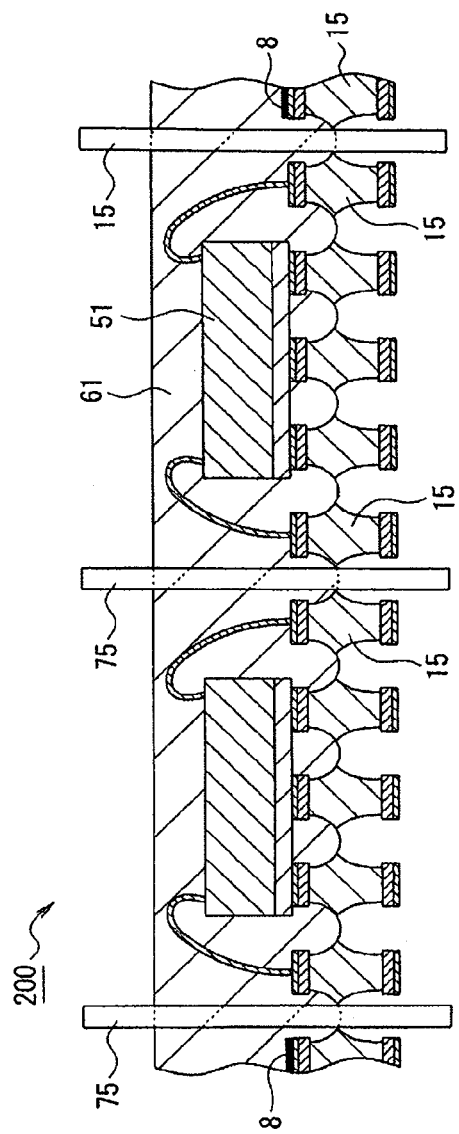
FIG.25A
FIG.25B ced in the plural 30
SUBSTRATE, MANUFACTURING METHOD THEREOF, METHOD FOR MANUFACTURING SEMICONDUCTOR DEVICE The entire disclosure of Japanese Patent Application No. 2008-090467, filed Mar. 31, 2008 is expressly incorporated by reference herein.

BACKGROUND

1. Technical Field

The present invention relates to a substrate, a manufacturing method thereof, a method for manufacturing a semiconductor device.

2. Related Art

There are two types of a semiconductor package, one is a peripheral type in which an external terminal is arranged on the periphery of a package, and the other is an area type in which an external terminal is disposed under a package. Referring to FIGS. 26A through 26C, the peripheral type package is typified by Dual Inline Package (DIP), Small Outline Package (SOP) and Quad Flat Package (QFP). Referring to FIG. 26D, in the peripheral type package, an integrated circuit (IC) element 210 is mounted on a chip mounting part called a die pad 201. An electrode on the IC element 210 and a lead 203 of a lead frame are coupled each other through a gold wire and the like. All areas other than a peripheral area of the lead 203 are sealed with resin and the peripheral type package is completed. The lead 203 is provided in the plural number, the lead that is disposed inside the resin package is called an inner terminal and the lead that is disposed outside the resin package is called an external terminal.

Referring to FIGS. 27A, 27B and FIGS. 28A, 28B, the area type package is typified by Ball Grid Array (BGA). In the area type package, the IC element 210 is mounted on a substrate 211, the substrate 211 and the IC element 210 are electrically coupled each other through a gold wire, solder or a gold bump, and the IC element 210 and other parts are sealed with resin. Referring to FIGS. 27A and 27B, the package in which the substrate 211 and the IC element 210 are coupled with a gold wire 213 is called as a gold wire type BGA.

Referring to FIGS. 28A and 28B, the package in which the substrate 211 and the IC element 210 are coupled through a bump 223 is called as a bump type BGA. There are some bump type BGAs with which resin sealing is not performed as illustrated in FIGS. 28A and 28B. Referring to FIGS. 27A through 28B, the external terminal of the area type is not a lead but an electrode (or a solder ball) 225 that is mounted on a lower face of the substrate 211.

Referring to FIGS. 29A through 29I, another type of the package has been proposed in recent years. A column shaped terminal 233 and a die pad 235 are formed on a metal plate 231 by electroplating, the IC element 210 is mounted on the die pad 235, the IC element 210 and the terminal 233 are coupled with the gold wire 213, the parts are sealed with resin, and the metal plate 231 is removed from a resin mold part 236. The remaining is diced into each piece of package in order to make it as a completed product.

More specifically, referring to FIGS. 29A and 29B, a resist solution is firstly applied onto the metal plate 231, and a resist pattern 237 is formed by conducting an exposure-development process. Referring to FIG. 29C, cupper or the like is deposited on the metal plate 231 which is exposed from the resist pattern 237 by electroplating so as to form the column shaped terminal 233 and the die pad 235. The resist pattern is then removed as shown in FIG. 29D. Referring to FIG. 29E, the IC element 210 is mounted on the die pad 235 that has been formed by the electroplating, and wire-bonding is conducted. Subsequently the IC element 210, the gold wire 213 and the like are sealed with resin as shown in FIG. 29F. Referring to FIG. 29G, the metal plate 231 is removed from the resin mold part 236. Finally the resin mold part 236 is diced into each piece of the completed product as shown in FIGS. 29H and 29I and the package is completed.

JP-A-2-240940 is a first example of related art. The first example discloses how to fabricate the peripheral type package. One face of a support part of a plate-shaped lead frame is half-etched, and an IC element is mounted on a die pad of the lead frame. Wire-bonding and resin sealing are subsequently performed, the other face of the support part whose face has been half-etched is then grinded so as to remove the support part, and the peripheral type package is completed. JP-A-2004-281486 is a second example of the related art. The second example discloses a technique to increase versatility of the area type package by arranging wiring lines when it is viewed in plan. JP-A-2006-108343 is a third example of the related art. The third example discloses a technique to dice the sealing resin and the like.

According to the hitherto known technique, any of the peripheral type package, the area type package, the package that is described above with reference to FIGS. 29A through 29I, and the package disclosed in the first example require a die pad or a substrate such as an interposer for mounting an IC element. This means that a lead frame, a substrate or a photomask (for forming a post) have to be customized depending on the size of the IC element and the number of external outputs (in other words, the number of the leads or balls) from the IC element. Especially in case of manufacturing diversified products in small quantities, a wide variety of lead frames, substrates and photo-masks are needed depending on the products, and this makes it difficult to reduce a manufacturing cost.

The second example realizes the area type package that can accommodate to a large to small sized chip by arranging wiring lines in a radial pattern extending outward from the center of a substrate. However, according to this technique, pad terminals of the IC element have to be arranged such that they are overlapped with the wiring lines that extend in the radial pattern outward from the center of the substrate when it is viewed in plan. Therefore design freedom in the pad arrangement is limited. In other words, the versatility of the package is increased but constraints on the IC element also increase.

SUMMARY

An advantage of some aspects of the present invention is to provide a substrate whose specification for mounting an IC element is standardized for various arrangements without increasing constraints on the IC element. Another advantage of some aspects of the invention is to provide a method for manufacturing the substrate and a method for manufacturing a semiconductor device.

According to a first aspect of the invention, a substrate on which an IC element is fixed includes: a plurality of metal posts arranged in a plurality of columns in a lengthwise direction and in a plurality of rows in a crosswise direction when viewed in a plan view, the plurality of metal posts having first faces and second faces that face an opposite side to a side that the first faces face; first marks, each of the first marks being disposed on extending lines of the plurality of columns; and second marks, each of the second marks being disposed on extending lines of the plurality of rows. Here the first face corresponds to a face that is coupled to the pad terminal of the IC element, and the second face corresponds to a face that is coupled to a mother board or the like.

In this case, the substrate may further include a supporting substrate that supports the second faces of the metal posts, the metal posts being bonded to the supporting substrate with adhesive. Here, the supporting substrate is for example a glass substrate.

In this case, the substrate may further include connecting parts that connect the metal posts at parts between the first and the second faces.

In this case, the metal posts may have the same shape and the same size.

In this case, the first and the second marks may be made of the same material as the material as the metal posts are made of.

In this case, the first and the second marks may be recessed portions formed in the adhesive. Here, the concave portions are formed by for example irradiating the adhesive with laser.

In this case, the first and the second marks have a pattern of a number, a character or a symbol.

According to the first aspect of the invention, the post can be used as a die pad on which the IC element is mounted or used as an external terminal of the IC element. Therefore the posts can be changed into the die pad and the external terminal depending on a shape and size of an IC fixing area. Thereby it is not necessary to prepare a specific die pad, lead frame and substrate (interposer or the like) which are especially made depending on a type of the IC element in order to build a semiconductor device. This means that a single type of the substrate that is used for mounting an element and an external terminal can be adopted for various types of the IC element because the substrate can accommodate various layouts of the pad terminals of the IC element. In this way, it is possible to reduce the manufacturing cost of the semiconductor device.

Moreover, according to the first aspect, each column of the metal posts arranged in the lengthwise direction can be recognized by using for example the first mark as a guide, and each row of the metal posts arranged in the crosswise direction can be recognized by using for example the second mark as a guide even after the metal posts are sealed with resin.

According to a second aspect of the invention, a method for manufacturing a substrate on which an IC element is fixed includes: a) forming a plurality of metal posts that are arranged in a plurality of columns in a lengthwise direction and in a plurality of rows in a crosswise direction when viewed in a plan view, the plurality of metal posts having first faces and second faces that face an opposite side to a side which the first faces face; b) forming first marks disposed on extending lines of the plurality of columns; and c) forming second marks disposed on extending lines of the plurality of rows.

In this case, the forming of the plurality of metal posts may include a step of bonding a second face of a metal plate to a supporting substrate with adhesive, the metal plate has a first face and the second face that faces an opposite side to a side which the first face faces, and a step of etching the bonded metal plate partially from the first face so as to form the plurality of the metal posts.

In this case, the forming of the plurality of metal posts may include forming the plurality of the metal posts and connecting parts that connect the metal posts by etching a metal plate partially at least from a first face of the metal plate. Here, the metal plate has the first face and a second face that faces an opposite side to a side which the first face faces, and the connecting parts connect the metal posts each other at parts between the first and the second faces.

According to the second aspect of the invention, it is possible to provide the substrate whose specification for mounting various types of an IC element is standardized without increasing constraints on layouts of pad terminals of the IC element. In this way, it is possible to reduce the manufacturing costs of the substrate and the semiconductor device equipped with the substrate.

Moreover, according to the second aspect of the invention, each column of the metal posts arranged in the lengthwise direction can be recognized by using for example the first mark as a guide, and each row of the metal posts arranged in the crosswise direction can be recognized by using for example the second mark as a guide even after the metal posts are sealed with resin.

According to a third aspect of the invention, a method for manufacturing a semiconductor device includes: providing a substrate that has a plurality of metal posts, first marks and second marks. The plurality of metal posts are arranged in a plurality of columns in a lengthwise direction and in a plurality of rows in a crosswise direction when viewed in a plan view, the metal posts have first faces and second faces that face an opposite side to a side which the first faces face, the metal posts include a first metal post and a second metal post. The method further includes fixing an IC element on the first face of the first metal post, coupling the IC element and the first face of the second metal post electrically through a conducting part, and sealing the IC element and the conducting part with resin. In the sealing of the IC element, resin is provided onto the substrate in such a way that at least a part of the first marks and at least a part of the second marks appear on a surface of the resin. The first mark is disposed on an extending line of each of the columns, and the second mark is disposed on an extending line of each of the rows.

In this case, the method for manufacturing a semiconductor device may further include dicing the resin by using the first and the second marks as a guide after the sealing.

With the method for manufacturing a semiconductor device according to the third aspect of the invention, it is possible to standardize the specification of the substrate for various types of an IC element without increasing constraints on layouts of pad terminals of the IC element. In this way, it is possible to reduce the manufacturing costs of the semiconductor device.

Moreover, according to the third aspect of the invention, each column of the metal posts arranged in the lengthwise direction can be recognized by using for example the first mark as a guide, and each row of the metal posts arranged in the crosswise direction can be recognized by using for example the second mark as a guide even after the metal posts are sealed with resin. In this way, a fiducial point for deciding a section line (or a dicing line) to cut the resin can be made clear and thereby it is possible to increase accuracy and efficiency in the dicing process.

BRIEF DESCRIPTION OF THE DRAWINGS

The invention will be described with reference to the accompanying drawings, wherein like numbers reference like elements.

FIG. 16 is a sixth drawing showing the method for manufacturing the semiconductor device 100 according to the first embodiment.

FIG. 22 is a second drawing showing the method for manufacturing the substrate 150 according to a second embodiment.

FIG. 25 is a second drawing showing the method for manufacturing the semiconductor device 200 according to the second embodiment.

DESCRIPTION OF EXEMPLARY EMBODIMENTS

Embodiments of the invention will be described. In the following description, the identical numerals are given to the identical structures and those explanations will not be repeatedly given.

First Embodiment

FIGS. 1 through 7 illustrate a method for manufacturing a substrate 50 according to a first embodiment of the invention. FIGS. 1A, 2A, 4A and 5 are bottom views of the substrate. FIGS. 1B, 2B and 4B are sectional end views along the line X1-X1', X2-X2' and X4-X4' in FIG. 1A, FIG. 2A and FIG. 4A respectively. FIGS. 6A through 7C are end views of the substrate.

Figure 1:
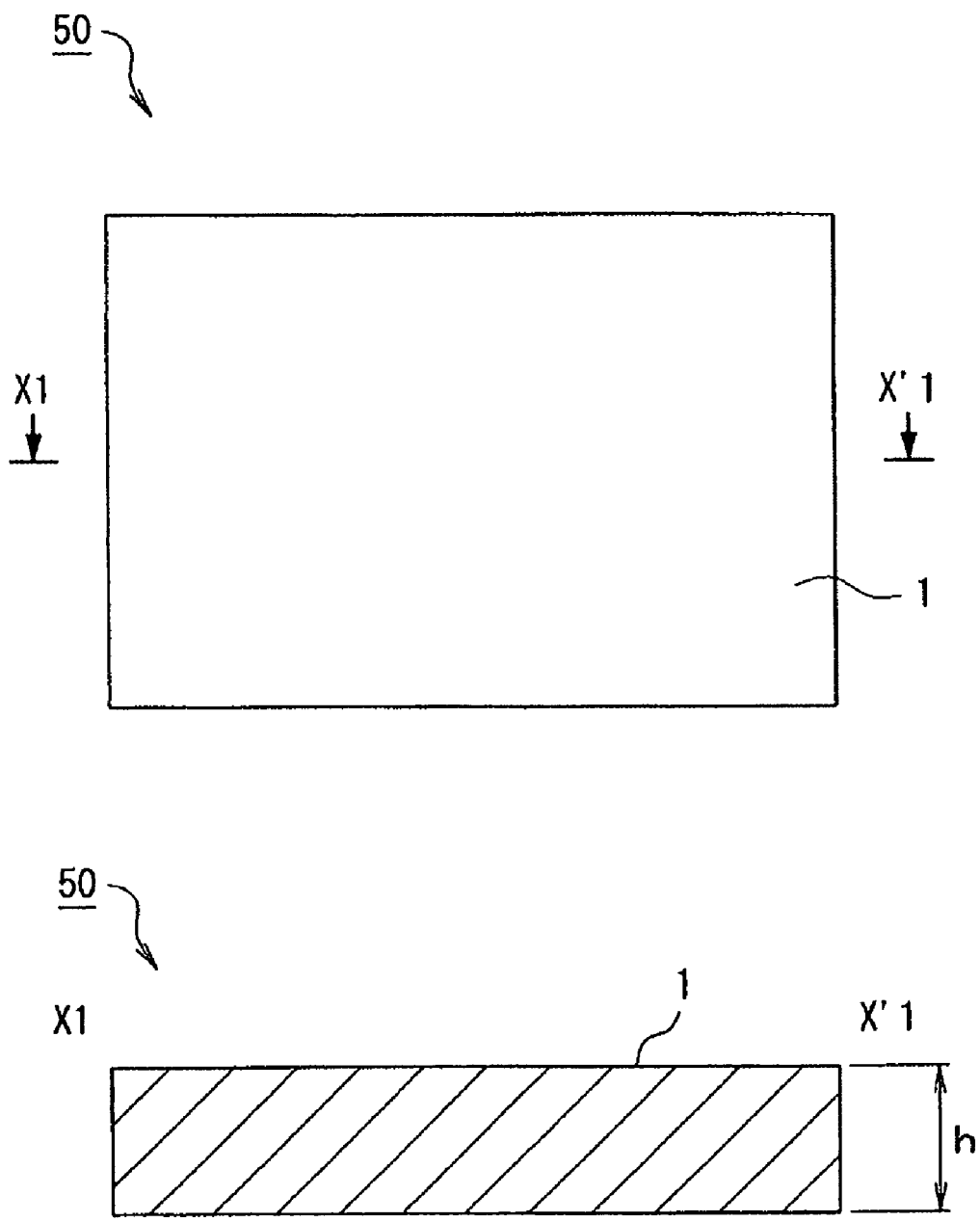
FIG. 1 is a first drawing showing a method for manufacturing a substrate 50 according to a first embodiment of the invention.
Figure 2A:
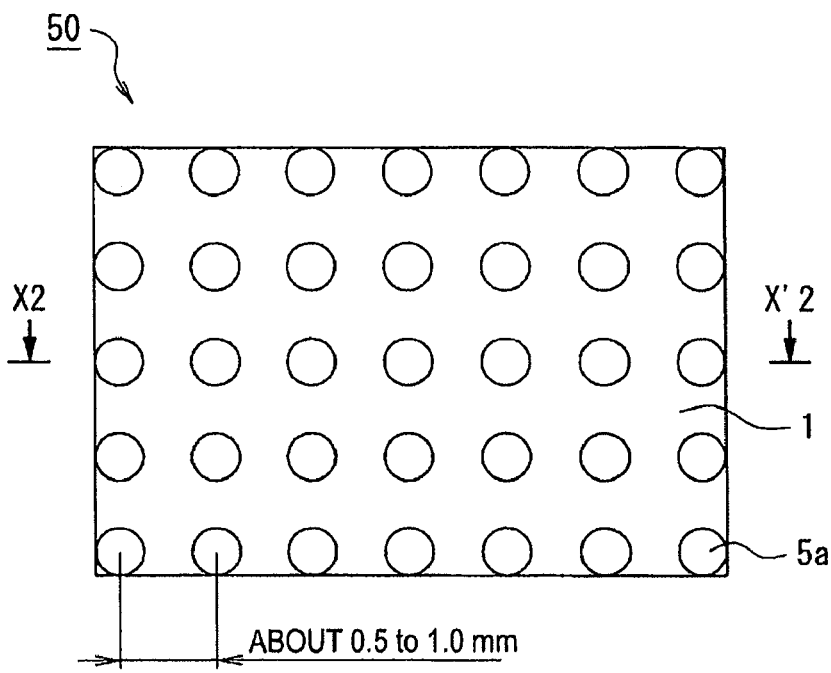
FIG. 2 is a second drawing showing the method for manufacturing the substrate 50 according to the first embodiment.
Figure 2B:
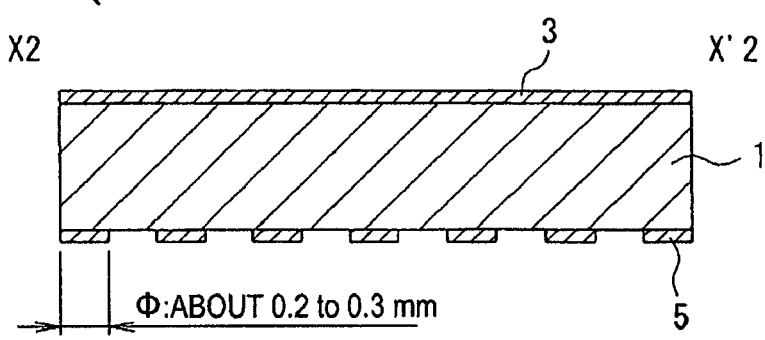

Referring to FIGS. 1A and 1B, a copper plate 1 (or a Cu strip) is prepared. The length and width of the copper plate 1 are not particularly limited provided that they are larger than an overall size of a package of a semiconductor device which is made from the copper plate 1. A thickness "h" of the copper plate 1 is for example about 0.10 to 0.30 mm. Referring to FIGS. 2A and 2B, a photo-resist 3 is blanket-deposited on an upper face of the copper plate 1, and a resist pattern 5 is formed on a lower face of the copper plate 1 so as to expose the surface of the plate partially. More specifically, for example, a positive-type resist is applied on the whole surface of the lower face of the copper plate 1, the resist is then exposed by using for example a photomask M1 shown in FIG. 9. The resist is subsequently developed and the resist pattern 5 is formed on the lower face of the copper plate 1.

Figure 9:
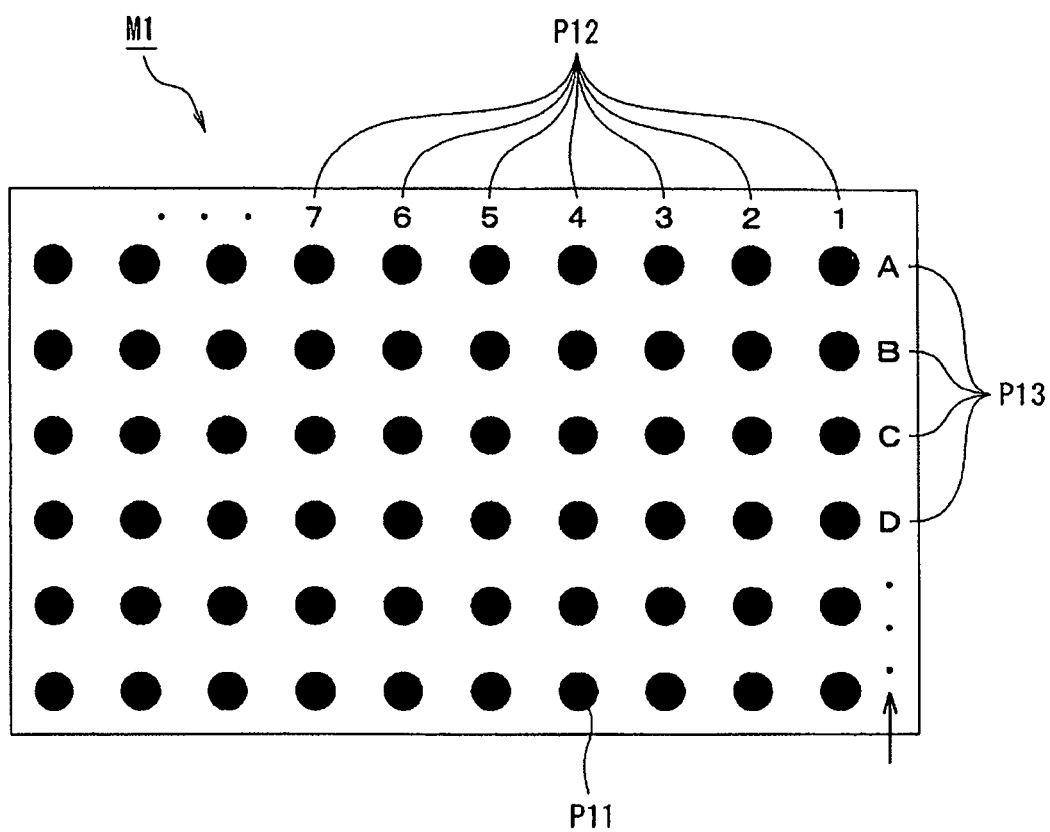
FIG. 9 illustrates an example of a photomask M1.

Referring to FIG. 9, the photomask M1 has for example a light shielding pattern P11 which has a precise circle pattern when viewed in plan, a light shielding pattern P12 that includes patterns of numbers (1, 2, 3, 4, . . . ), and a light shielding pattern P13 that includes patterns of characters (A, B, C, D, . . . ). The light shielding pattern P11 is provided in the plural number in crosswise and lengthwise directions when viewed in plan.

The light shielding pattern P12 is disposed on an extension line of each column of the plurality of the light shielding patterns P11 arranged in the lengthwise direction. A different number is provided corresponding to the column of the light shielding pattern P11. For example, referring to FIG. 9, the figure "1" is disposed on the first column of the light shielding patterns P11 counted from the right hand side, the figurer "2" is disposed on the second column counted from the right, and the figurer "3" is disposed on the third column counted from the right.

The light shielding pattern P13 is disposed on an extension line of each row of the plurality of the light shielding patterns P11 arranged in the crosswise direction. A different character is provided corresponding to the row of the light shielding pattern P11. For example, referring to FIG. 9, the letter "A" is disposed on the first row of the light shielding patterns P11 counted from the upper hand side, the letter "B" is disposed on the second row counted from the upper hand side, and the letter "C" is disposed on the third row. Areas other than the area where the light shielding patterns P11, P12 and P13 are provided are a transmissive area through which light can be transmitted.

By using the above-described photomask M1, the positive type resist is exposed and the light shielding patterns P11, P12 and P13 are transferred onto the lower face of the copper plate 1. Referring to FIGS. 2A and 2B, in this way, the resist pattern 5 that has the precise circle shape when viewed in plan, the resist pattern having a number shape when viewed in plan, and the resist pattern having a character shape when viewed in plan are formed though the latter two resist patterns are not illustrated in the drawings. A distance (a pitch) between the centers of two adjacent resist patterns 5 is set for example 0.5 to 1.0 mm, and a diameter Φ is for example about 0.2 to 0.3 mm as shown in FIGS. 2A and 2B.

Figure 3:
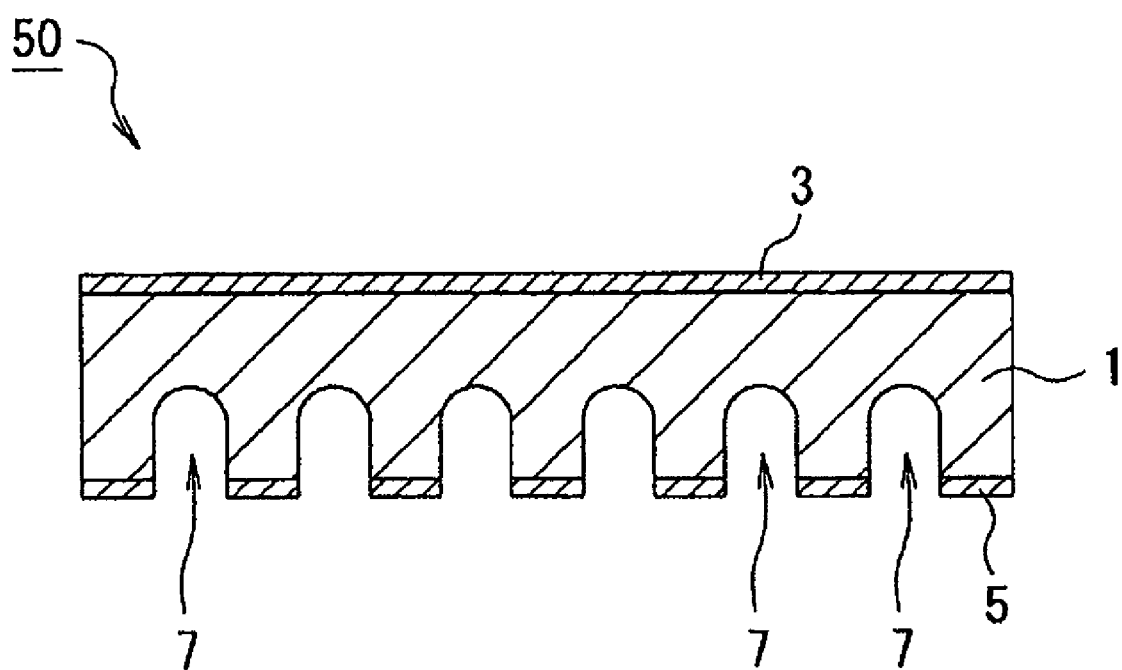
FIG. 3 is a third drawing showing the method for manufacturing the substrate 50 according to the first embodiment.
Figures 4A, 4B:
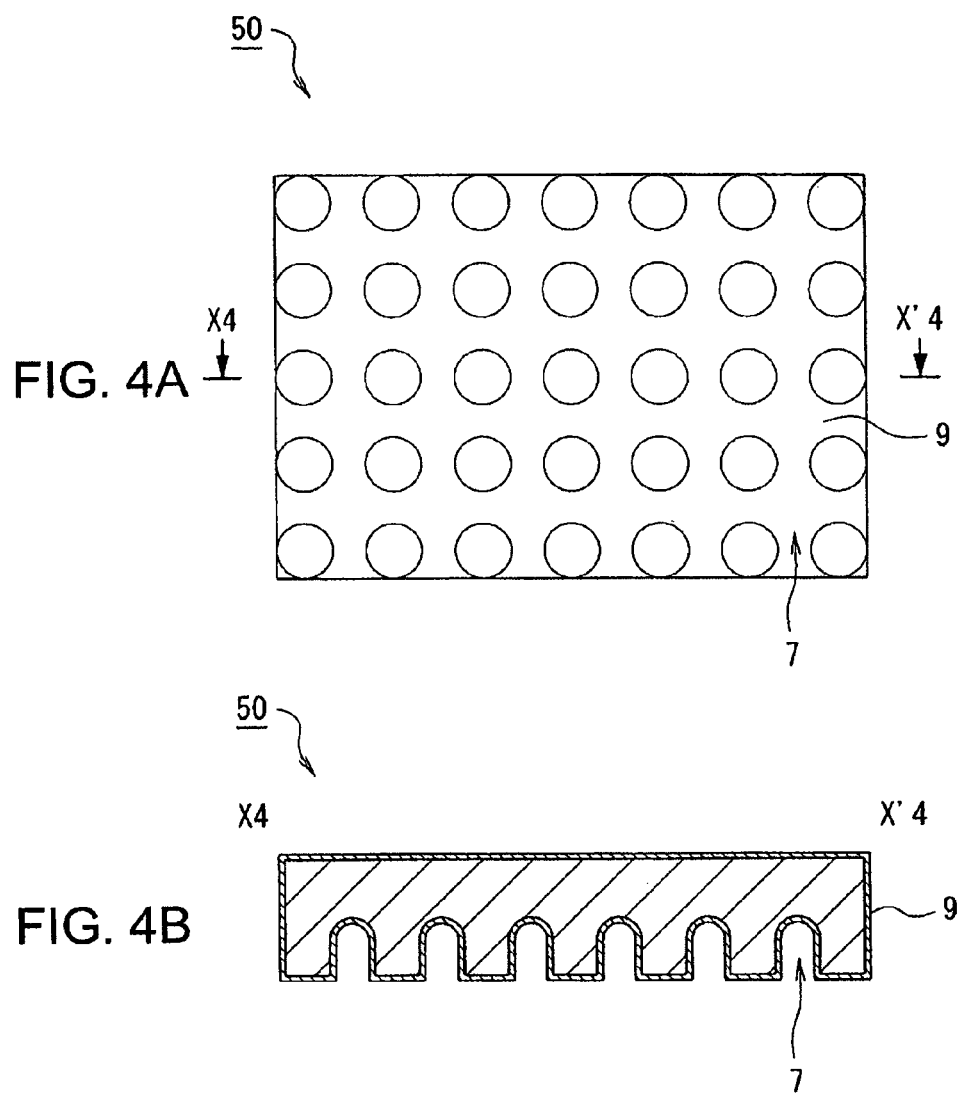
FIG. 4 is a fourth drawing showing the method for manufacturing the substrate 50 according to the first embodiment.
Figure 5:
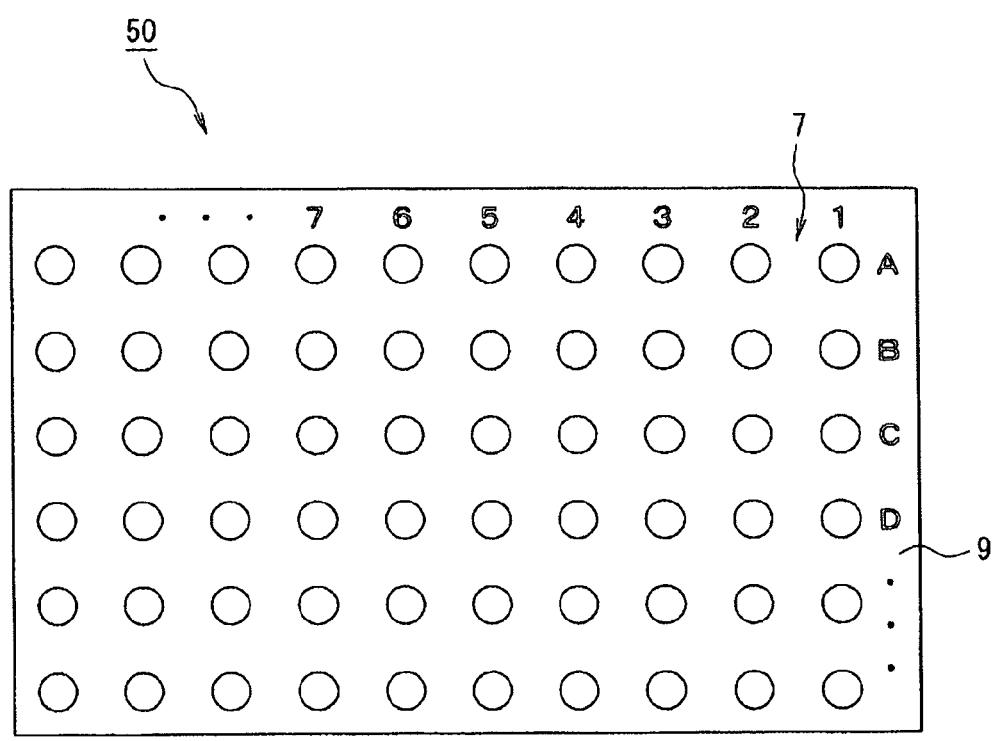
FIG. 5 is a fifth drawing showing the method for manufacturing the substrate 50 according to the first embodiment.

Referring now to FIG. 3, the lower face of the copper plate 1 is half-etched (in other words, etched till a halfway point in the thickness of the copper plate 1) by using the circular shaped resist pattern 5 and both of the resist patterns having a number shape and a character shape (unshown in the drawing) as a mask, and a concave portion 7 is formed in the lower face of the copper plate 1. To etch the copper plate 1, a ferric chloride solution is for example used. The photo resist 3, the resist pattern 5 and the resist patterns having a number shape and a character shape (unshown in the drawing) are then removed from the copper plate 1. Referring to FIGS. 4A and 4B, the upper face and the lower face of the copper plate 1 are coated with a metal thin film 9 that is made of silver (Ag), palladium (Pd) or the like. This coating of the metal thin film 9 can be performed before the etching of the copper plate 1. After the concave portion 7 is formed in the lower face of the copper plate 1 and the metal thin film 9 is provided, the plurality of the circular, number and character figures will emerge as illustrated in FIG. 5.

Figure 6A:
FIG. 6 is a sixth drawing showing the method for manufacturing the substrate 50 according to the first embodiment.
Figure 6B:
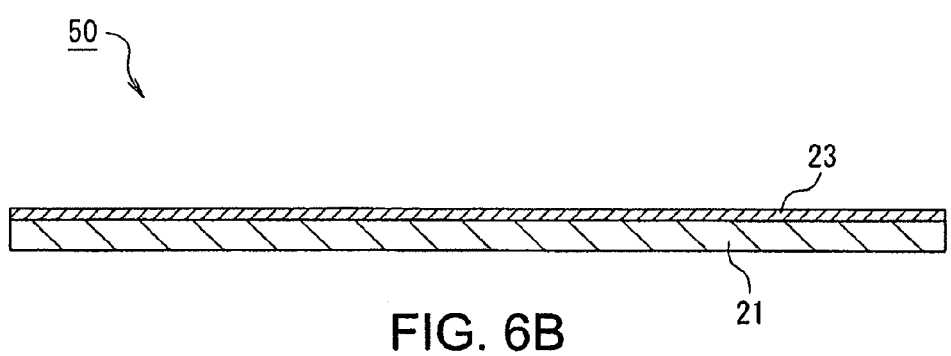
Figure 6C:
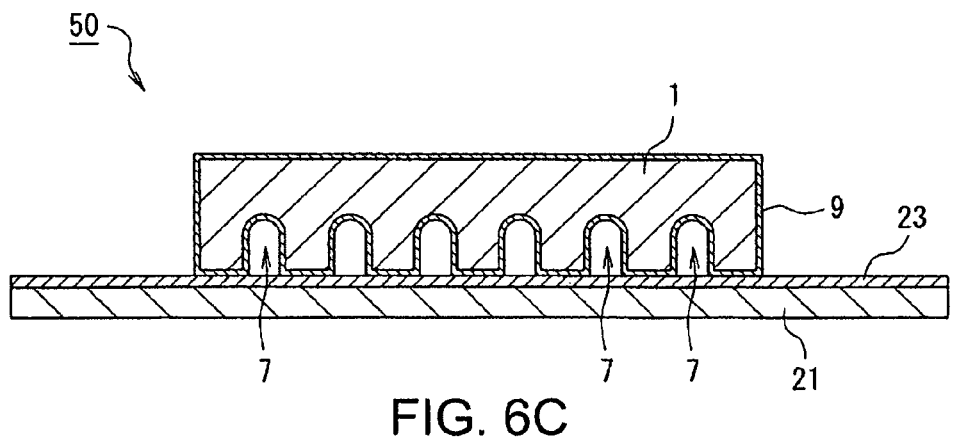

Referring to FIG. 6A, a supporting substrate 21 is prepared before, after or simultaneously with the above-described coating process and the like. Adhesive 23 is applied onto the upper face of the supporting substrate 21 as shown in FIG. 6B. The supporting substrate 21 is for example a glass substrate. The adhesive 23 is for example a solder resist, an ultraviolet curable adhesive (or UV adhesive), a thermosetting adhesive or the like. Referring to FIG. 6C, the lower face of the copper plate 1 that has been coated with the thin metal film is then pressed and jointed onto the upper face of the supporting substrate 21 on which the adhesive 23 has been applied.

Figure 7A:
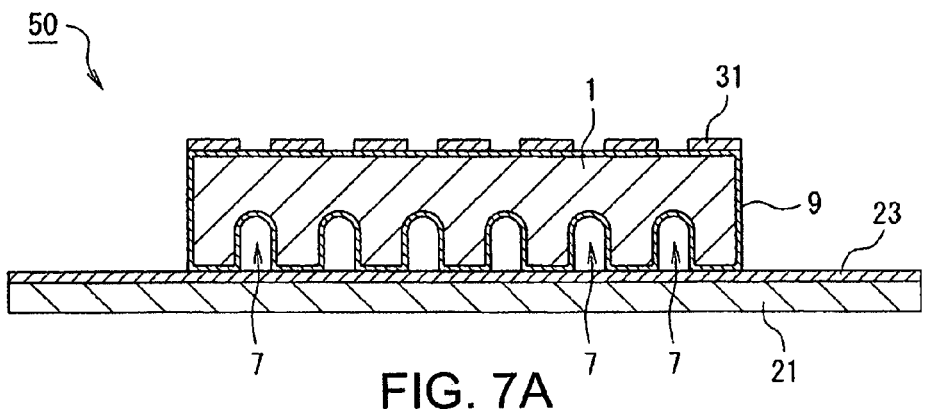
FIG. 7 is a seventh drawing showing the method for manufacturing the substrate 50 according to the first embodiment.
Figure 10A:
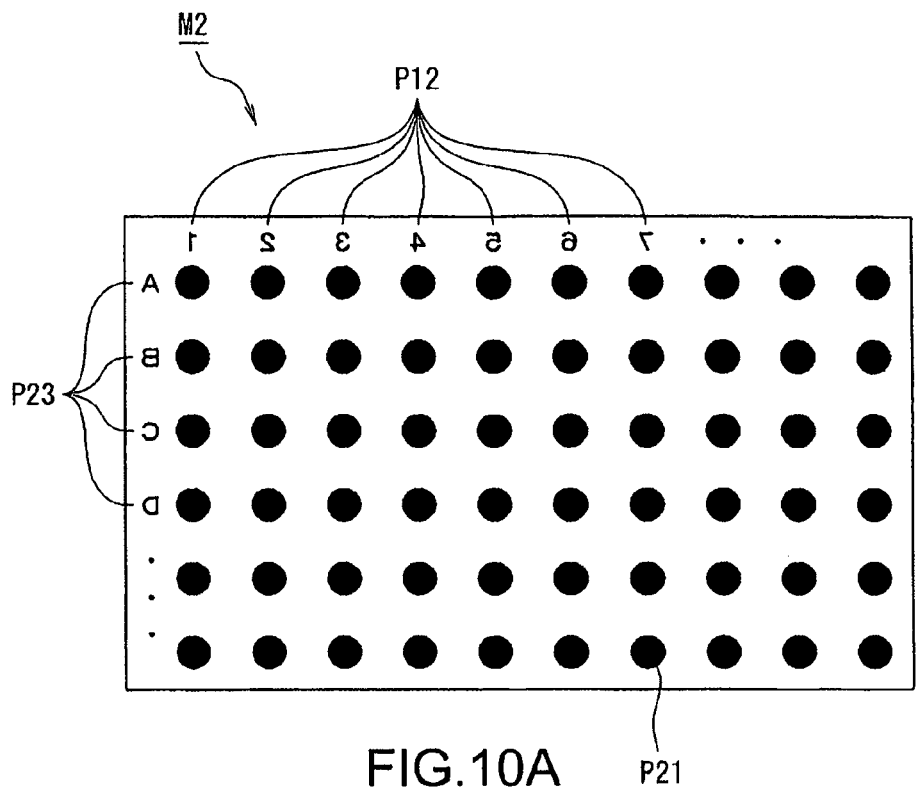
FIG. 10 illustrates an example of photomasks M2, M2'.

Referring to FIG. 7A, a resist pattern 31 is formed on the upper face of the copper plate 1. The resist pattern 31 has an opening in an area right above the concave portion 7, and other areas (more specifically, areas right above the regions where the plurality of the precise circles, numbers and characters are emerged) of the resist covers the plate. For example, a positive type resist is applied on the overall upper face of the copper plate 1, the resist is subsequently exposed by using a photomask M2 which is illustrated in FIG. 10A. The resist is then developed and the resist pattern 31 is provided on the upper face of the copper plate 1.

Referring to FIG. 10A, the photomask M2 has a pattern of a mirrored image of the photomask M1. In other words, the photomask M2 has for example a light shielding pattern P21 which is a precise circle when viewed in plan, a light shielding pattern P22 that includes mirrored images of the numbers (1, 2, 3, 4, . . . ), and a light shielding pattern P23 that includes mirrored images of the characters (A, B, C, D, . . . ). The light shielding pattern P21 is provided in the plural number in crosswise and lengthwise directions when viewed in plan. The light shielding pattern P22 is disposed on an extension line of each column of the plurality of the light shielding patterns P21 arranged in the lengthwise direction. A mirrored image of a different number (hereinafter also referred as a mirror number) is provided corresponding to each column of the light shielding pattern P21.

For example, referring to FIG. 10A, a mirrored image of the figure "1" is disposed on the first column of the light shielding patterns P21 counted from the left hand side, a mirrored image of the figurer "2" is disposed on the second column counted from the left, and a mirrored image of the figurer "3" is disposed on the third column counted from the left. The light shielding pattern P23 is disposed on an extension line of each row of the plurality of the light shielding patterns P21 arranged in the crosswise direction. A mirrored image of a different character (hereinafter also referred as a mirror character) is provided corresponding to the row of the light shielding pattern P21. For example, referring to FIG. 10A, a mirrored image of the letter "A" is disposed on the first row of the light shielding patterns P21 counted from the upper hand side, a mirrored image of the letter "B" is disposed on the second row counted from the upper hand side, and a mirrored image of the letter "C" is disposed on the third row.

By using the above-described photomask M2, the positive type resist is exposed and the light shielding patterns P21, P22 and P23 are transferred onto the upper face of the copper plate 1. In this way, the resist pattern 31 that has the precise circle pattern when viewed in plan, the resist pattern having the mirror number pattern when viewed in plan, and the resist pattern having the mirror character pattern when viewed in plan are formed, though the latter two resist patterns are not illustrated in the drawing.

Figure 7B:
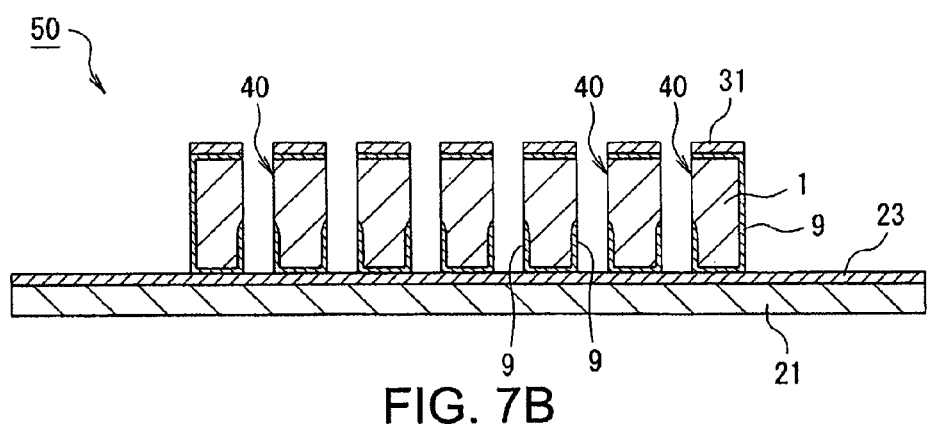
Figure 7C:
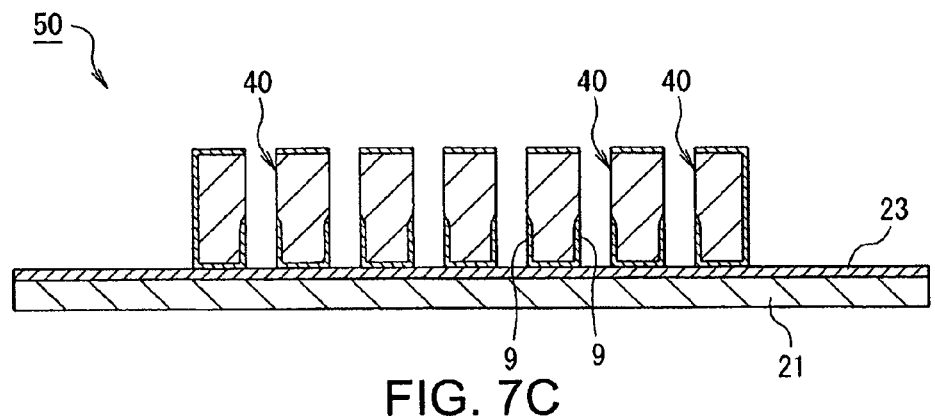

Referring to FIG. 7B, the copper plate 1 is etched from its upper face side toward the lower face side by using the resist pattern 31 that has the precise circular pattern and the resist patterns that have the mirror number pattern and the mirror character pattern as a mask. The plate is etched till unnecessary parts are penetrated and a cylindrical electrode (or a post) 40 which is provided in the plural number is formed. After the plurality of the posts 40 is formed from the copper plate 1, the resist pattern 31 and the resist patterns having the mirror number pattern and the mirror character pattern are removed from the upper faces of the posts 40 as shown in FIG. 7C. Through the above-described process, the substrate 50 is completed.

Figure 8A:
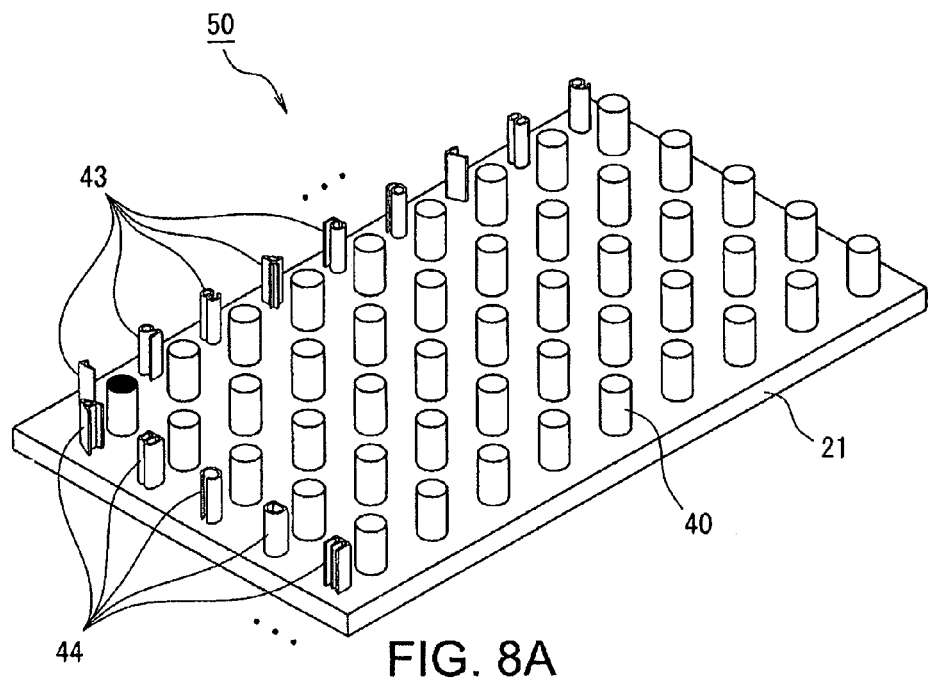
FIG. 8 shows an example of the substrate 50 according to the first embodiment.

Referring to FIG. 8A, the completed substrate 50 has the plurality of the posts 40 that are arranged in the lengthwise and crosswise directions when viewed in plan, the mark 43 that is disposed at an end of each column of the posts 40 arranged in the lengthwise direction, and the mark 44 that is disposed at an end of each row of the posts 40 arranged in the crosswise direction. The posts 40, and the marks 43, 44 are jointed to the supporting substrate 21 with adhesive (not shown in the drawing). FIG. 8 illustrates the substrate 50 from its top side so that the marks 43, 44 are shown as a mirror number or a mirror character. When the substrate 50 is viewed from its bottom side, the marks 43, 44 are recognized as a normal (un-mirrored) number or character through the supporting substrate 21 which can be made of glass or the like.

After the substrate 50 is completed, the upper face (front face) of the post 40 which is disposed in a predetermined position is colored by for example an ink jet method or a laser marking method so as to form a recognition mark 8. When the recognition mark 8 is formed by the ink jet method, a heat resistant multicolor ink, a multicolor plating material or the like can be used as a coloring material. Referring to FIG. 8A, the plurality of the posts 40 made from the copper plate 1 is provided on the supporting substrate 21. The posts 40 have the same shape and size and are arranged in the crosswise and lengthwise directions at an equal interval. By providing the recognition mark 8 on the predetermined post 40, an IC fixing area in a substrate 150 is recognized when the IC element is attached (or die-attached) to the substrate 150. Therefore it is possible to dispose the IC element in the IC fixing area with a high positional accuracy.

A method for manufacturing a semiconductor device 100 by installing a bare IC element on the substrate 50 will be now described.

FIGS. 11 through 17 illustrate a method for manufacturing the semiconductor device 100 according to the first embodiment of the invention. More specifically, FIGS. 11A through 14A and FIG. 16A are plan views of the device in case of an IC element 151 having a size of for example 2 mm square. FIGS. 11B through 14B and FIG. 16B are plan views of the device in case of the IC element 151 having a size of for example 1 mm square. FIGS. 11C through 14C and FIG. 16C are sectional end views of the device along the line Y11-Y'11 through Y14-Y'14, and Y16-Y'16 in FIGS. 11B through 14B and FIG. 16B respectively.

Figure 11A:
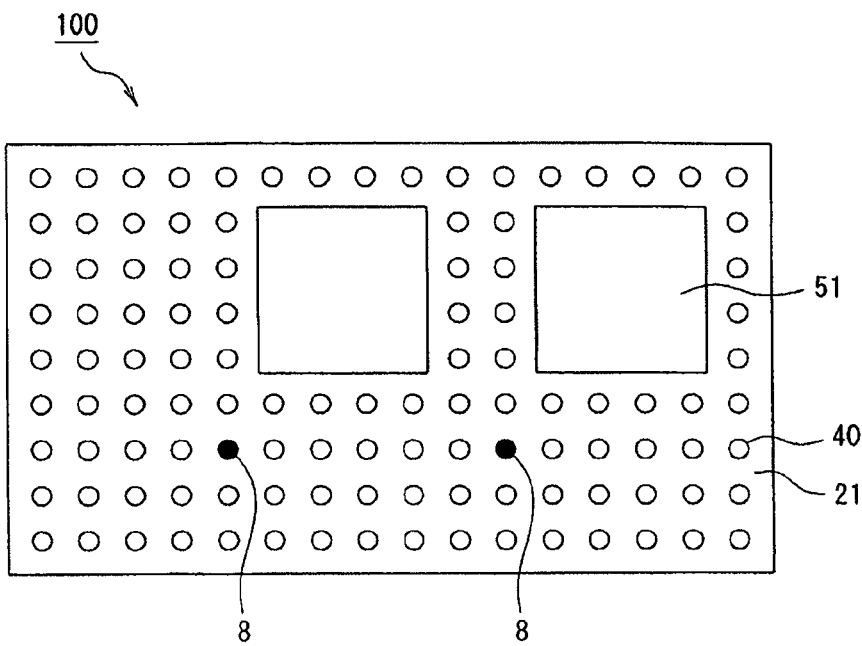
FIG. 11 is a first drawing showing a method for manufacturing a semiconductor device 100 according to the first embodiment of the invention.
Figures 11B, 11C:
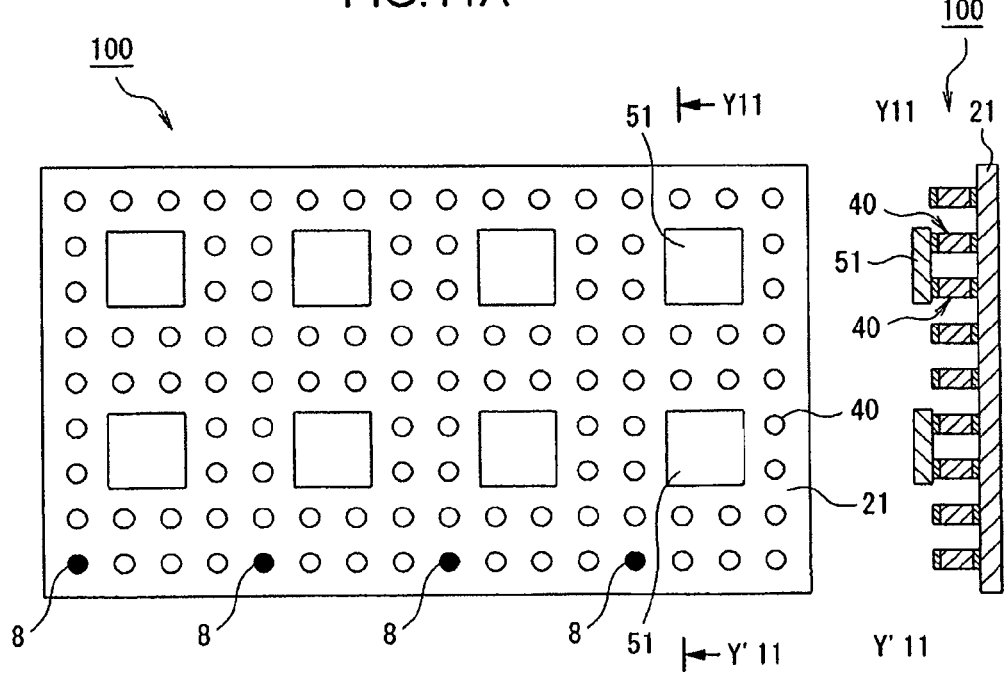

Referring to FIG. 11A through 11C, unshown adhesive is applied on upper faces (or the lower face of the IC element 51) of the posts 40 that exist in the IC fixing area. The adhesive can be for example a thermosetting paste or sheet. Then the IC fixing area is identified by using the recognition mark 8, and the IC element 51 is aligned and disposed in the identified IC fixing area. The lower face (a face opposing the face where the pad electrode of the IC element 51 is provided) of the IC element 51 is placed onto the posts 40 in the IC fixing area as the IC element is aligned, and the IC element is fixed (die-attached) there.

Figure 12A:
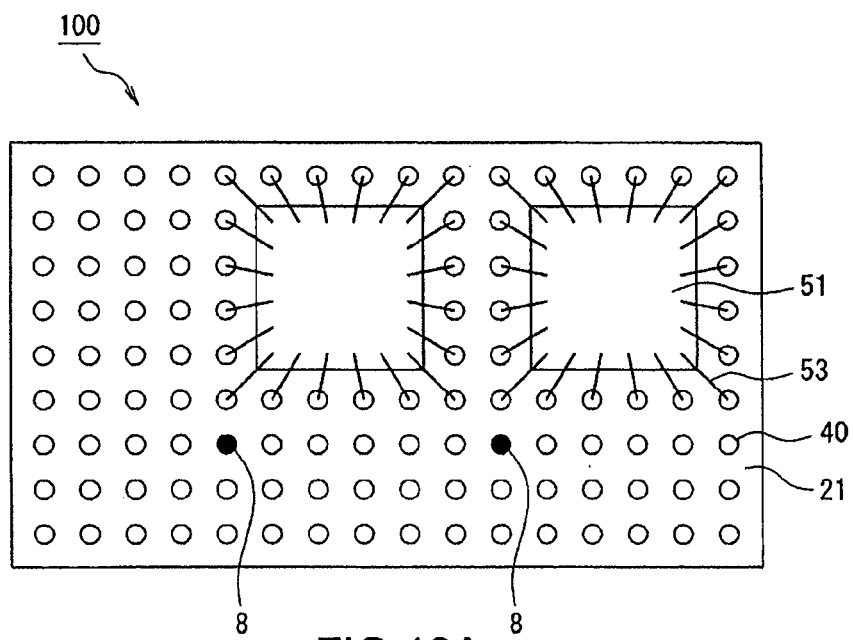
FIG. 12 is a second drawing showing the method for manufacturing the semiconductor device 100 according to the first embodiment.
Figures 12B, 12C:
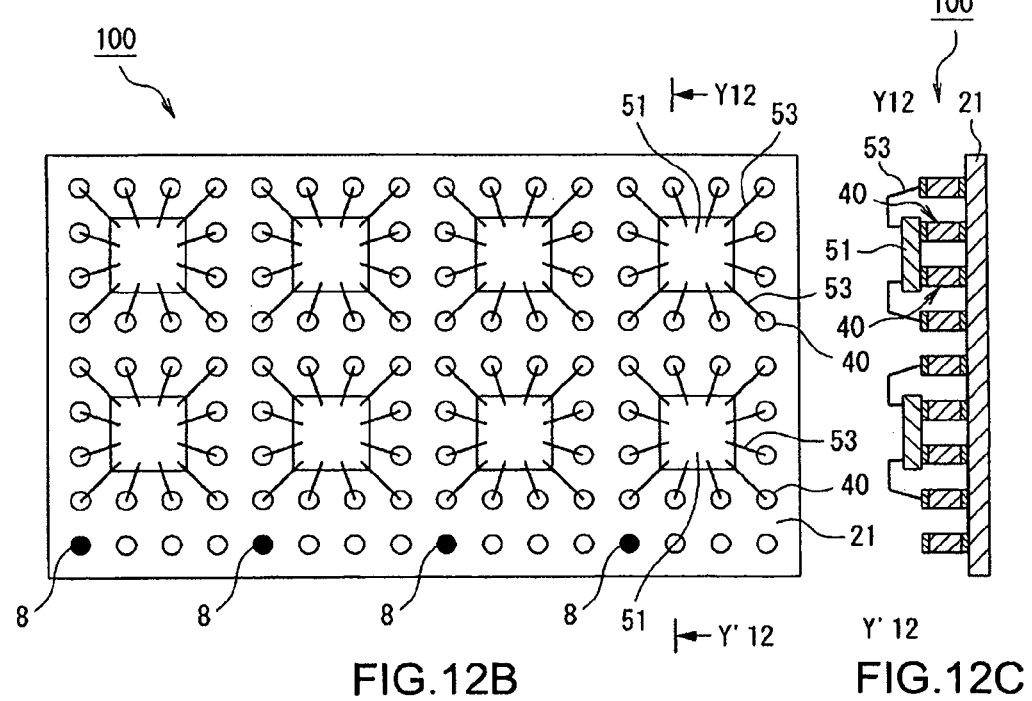

Referring to FIGS. 12A through 12C, an upper face of the post 40 that is located in an area other than the IC fixing area (in other words, an area remote from the IC element 51) and a pad terminal that is disposed on the front face of the IC element 51 are coupled with for example a gold wire 53 (a wire-bonding step).

At this point, the post 40 that is going to serve as the external terminal can be identified by using the recognition mark 8 as a guide, and one end of the gold wire 53 can be coupled to the identified post 40. In this way, the post 40 which is going to serve as the external terminal can be accurately found among the plurality of the posts 40 and it is possible to place the gold wire 53 at the identified post 40 efficiently. If the recognition mark 8 is electrically conductive and so is the post 40, for example, the gold wire 53 is coupled to the post 40 on which the recognition mark 8 is provided, and the post 40 can be used as the external terminal.

Figure 13A:
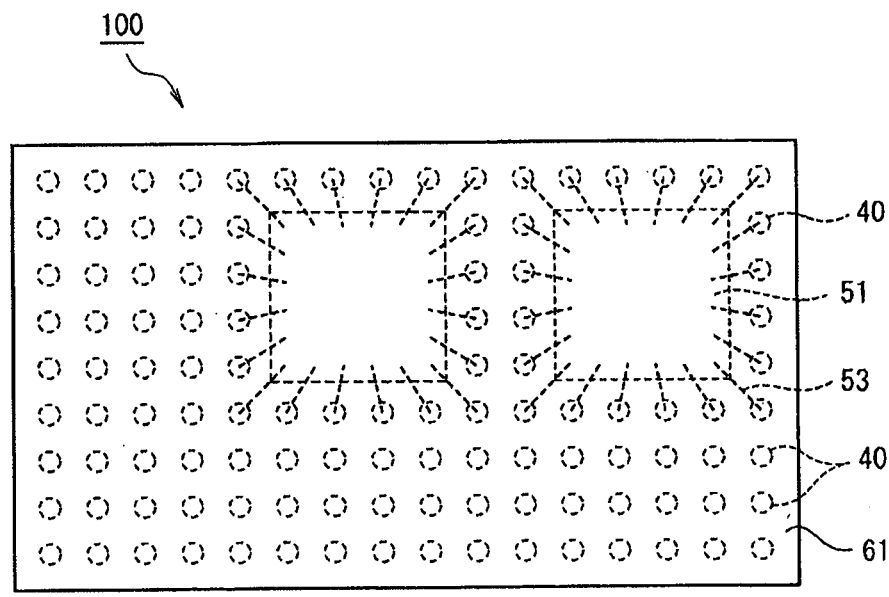
FIG. 13 is a third drawing showing the method for manufacturing the semiconductor device 100 according to the first embodiment.
Figure 13B:
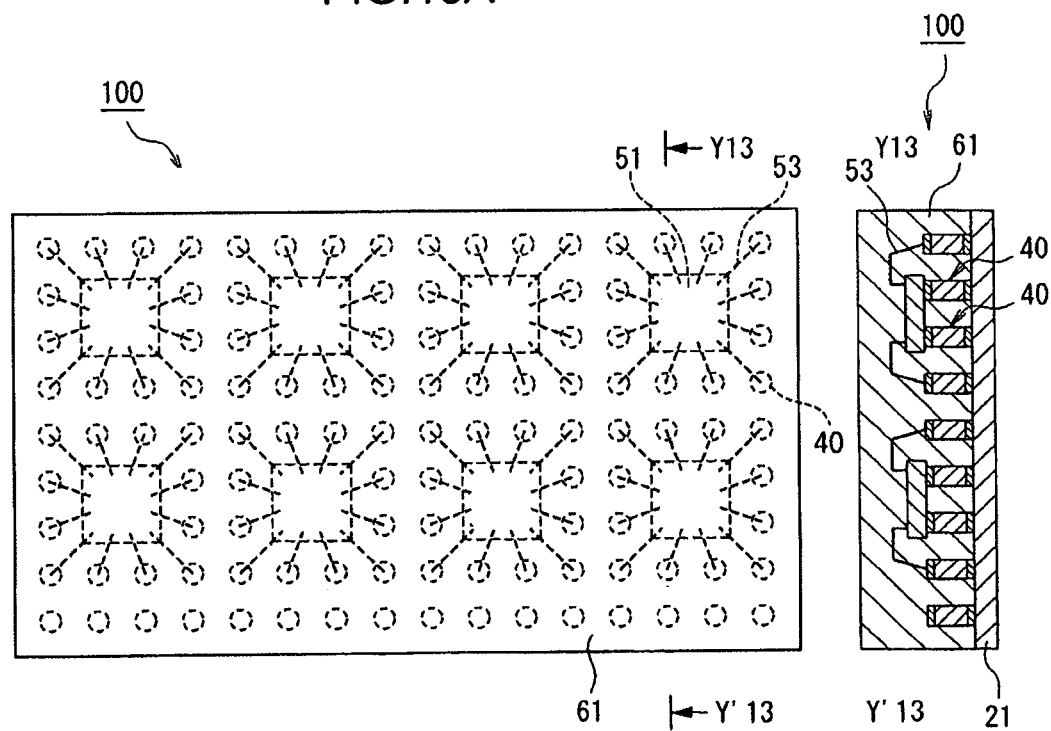
Figure 13C:
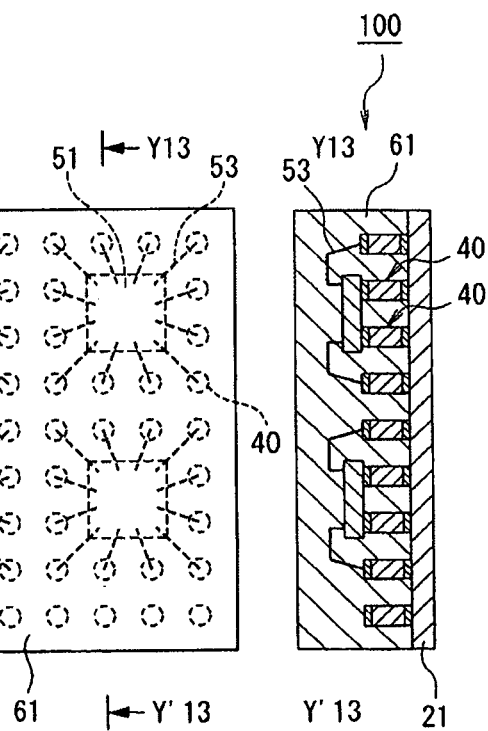

Referring to FIGS. 13A through 13C, a mold resin 61 is provided on the upper face side of the supporting substrate 21, and the upper face area of the supporting substrate 21 including the IC element 61, the gold wire 53, the post 40, and the marks 43, 44 for example shown in FIG. 8A is blanket-sealed with the resin 61 (a resin sealing step). In this resin sealing step, for example, a metal mold (unshown in the drawing) that can contain the plurality of the IC elements 51, the plurality of the posts 40, the marks 43, 44 and the like is placed over the supporting substrate 21, then the high temperature (for example higher than 150° C.) mold resin 61 is injected into the metal mold. The mold resin 61 here is for example a thermosetting epoxy resin or the like. The supporting substrate 21 is for example a glass substrate as mentioned above, and its coefficient of thermal expansion is relatively small. Therefore the substrate is not stretched in the crosswise or lengthwise direction when viewed in plan even if heat as high as 200° C. is applied in the resin sealing step. For this reason, the distance between two adjacent posts 40 can remain unchanged during the resin sealing step.

Figure 14A:
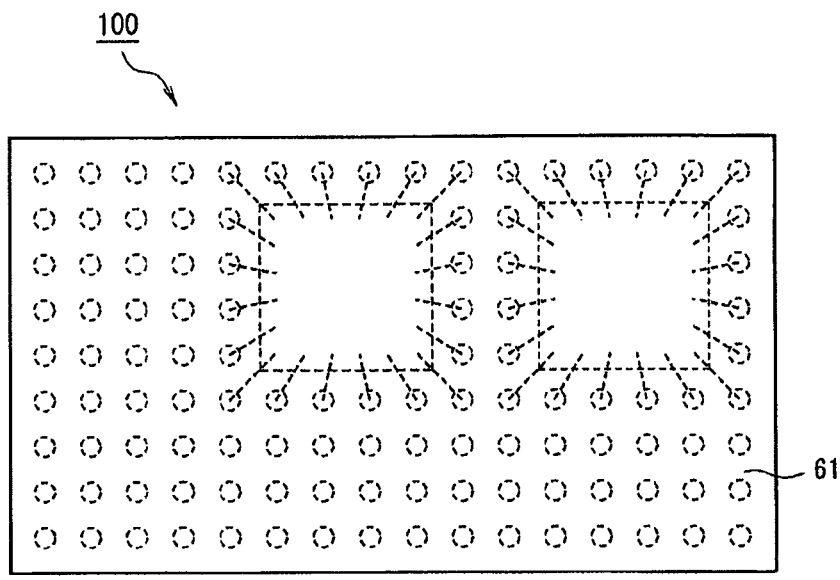
FIG. 14 is a fourth drawing showing the method for manufacturing the semiconductor device 100 according to the first embodiment.
Figures 14B, 14C:
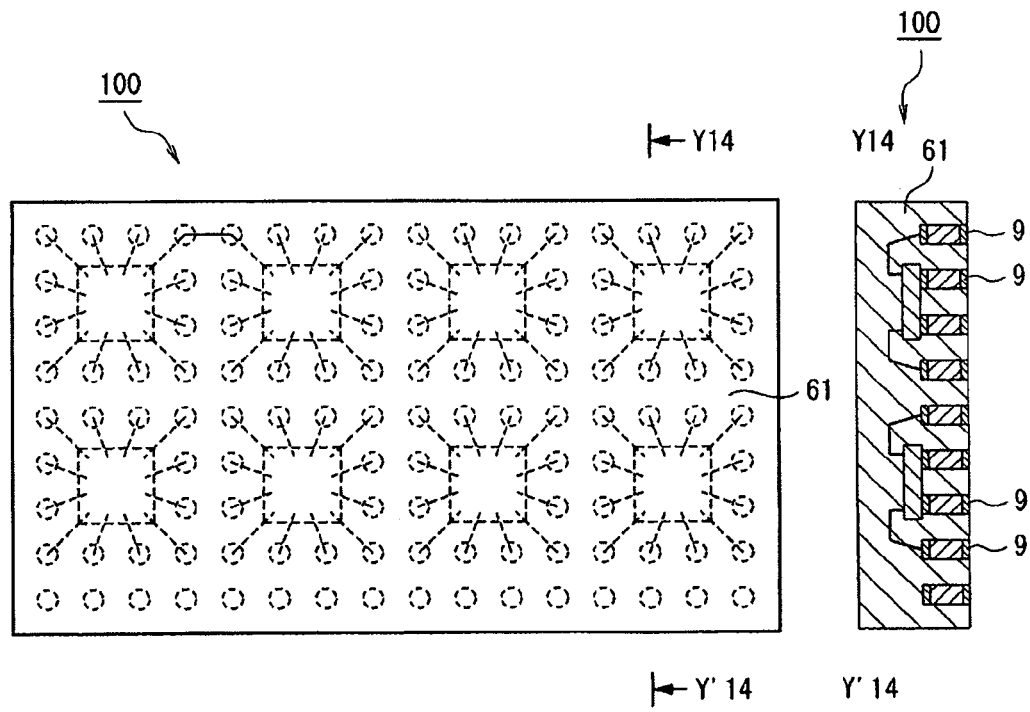

Referring to FIGS. 14A through 14C, the mold resin 61 containing the IC element 51, the gold wire 53, the post 40 and the marks 43, 44 (see FIG. 8A) is removed from the supporting substrate. When an ultraviolet curable adhesive is used as the adhesive 23, adhesion can be weakened by irradiating the adhesive with ultraviolet (UV) before actually peeling the supporting substrate off. The mold resin 61 containing the IC element 51 can also be removed from the supporting substrate by simply using a mechanical force. Once the mold resin 61 is removed from the supporting substrate, the post 40 that is coated with the thin metal film and the marks 43, 44 that are also coated with the thin metal film are exposed from the lower face (the face peeled off from the supporting substrate) of the mold resin 61 as for example illustrated by FIG. 15. In the steps shown in FIGS. 14A through 14C, the remaining adhesive after the mold resin 61 is removed from the supporting substrate can be left either on the mold resin 61 side or the supporting substrate side.

Referring to FIGS. 14A through 14C, a product mark (not shown in the drawings) and the like is inscribed on the upper face (the face where the terminals are not exposed) of the mold resin 61 by using for example ink and laser. Referring to FIGS. 16A through 16C, an ultraviolet curable tape 63 (or an UV tape) is sequentially provided on the whole upper face of the mold resin 61. Here, when the UV tape 63 is made of an optically transparent material, the UV tape 63 can be sequentially provided on the whole lower face where the marks 43, 44 and the like are exposed instead of the upper face of the mold resin 61.

Referring to FIGS. 16A and 16B, a dicing blade 75 is contacted with the face (the lower face) of the mold resin 61 where the UV tape 63 is not provided in order to cut the mold resin 61 according to a product profile (a dicing step). In this dicing step, the mold resin 61 is divided into an individual resin package piece and unnecessary parts of the resin which cannot become a product are removed at the same time. During the dicing step, the marks 43, 44 are exposed from the lower face of the mold resin 61 for example as shown in FIG. 15, therefore the mold resin 61 can be diced by using the marks 43, 44 as a guide.

Figure 15:
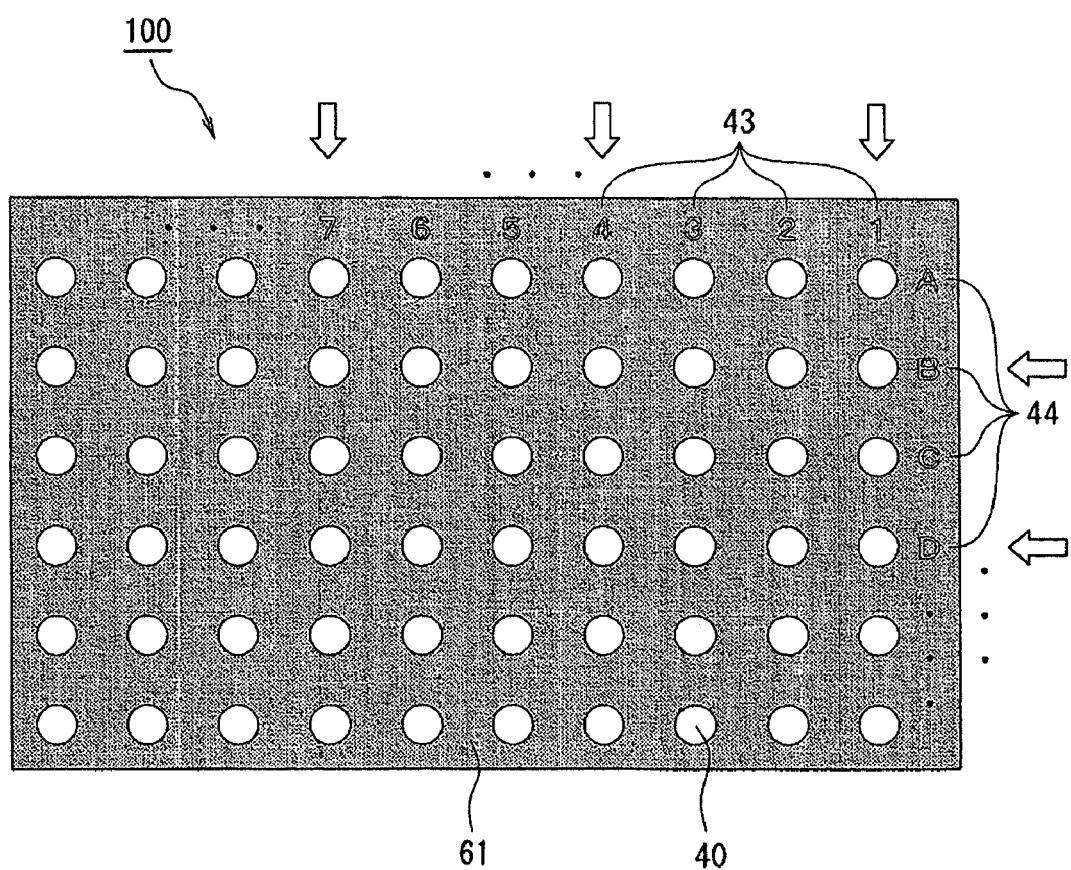
FIG. 15 is a fifth drawing showing the method for manufacturing the semiconductor device 100 according to the first embodiment.

More specifically, referring to FIG. 15, the mold resin 61 that contains the plurality of the IC elements, the marks 43, 44 and the like and on which the UV tape is provided is set in an unshown dicing machine. An image pickup unit (for example a charge-coupled device [CCD], a complementary metal-oxide semiconductor [CMOS] image sensor or the like) that is equipped in the dicing machine images and recognizes the positions of the marks 43, 44. By using the marks 43, 44 as a guide, a dicing line of the mold resin 61 is decided, and the dicing blade 75 cuts the mold resin 61 along the dicing line. For example, when the dicing machine is programmed to cut out the columns of the numbers "1", "4", "7" and the rows of the characters "B", "D" as indicated by the arrows in FIG. 15, the dicing machine searches the columns of the numbers "1", "4", "7" and the rows of the characters "B", "D", then the dicing blade 75 cuts out the resin mold 61 along the found columns of the numbers "1", "4", "7" and the found rows of the characters "B", "D".

Figure 17A:
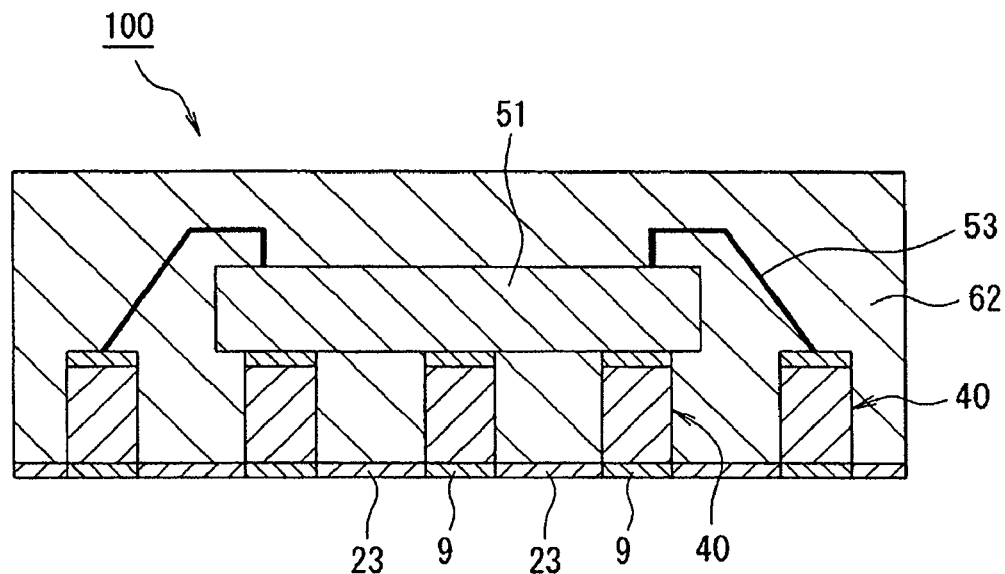
FIG. 17 is a seventh drawing showing the method for manufacturing the semiconductor device 100 according to the first embodiment.
Figure 17B:
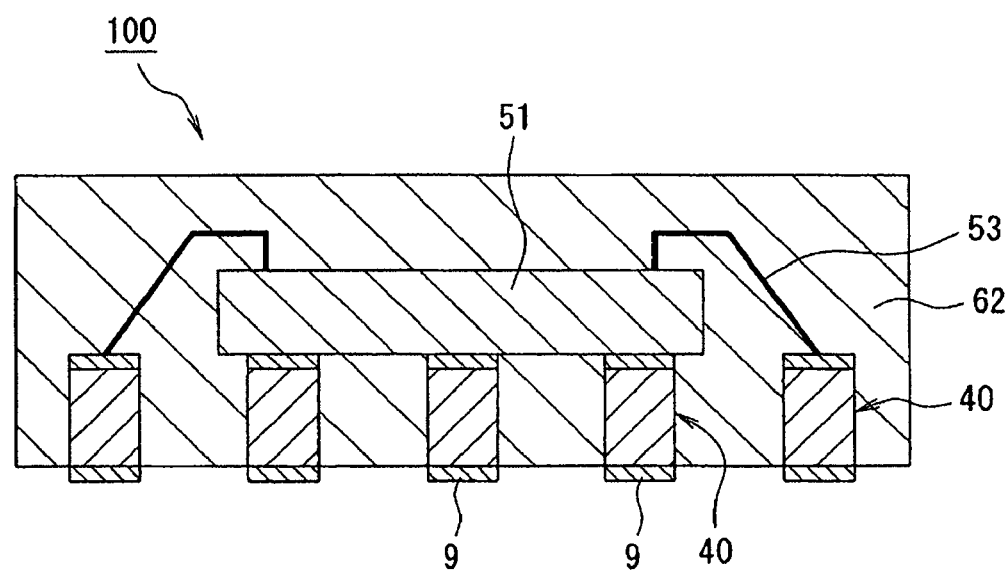

Referring to FIGS. 17A through 17C, through the above-described steps, the semiconductor device 100 that includes the IC element 51, the post 40, the gold wire 53, and the resin package 62 which seals these components is completed. The lower face side of the post 40 which is exposed from the resin package can be coated with the metal thin film 9, or a solder ball can be further mounted so as to cover the metal thin film 9. Examples of a chip size, the number of the terminals under the chip (in other words, the number of the posts), the maximum number of the external terminals and a dimension of the package, which can be applied to the semiconductor device 100 according to the first invention, are listed in Table 1 below.

TABLE 1

| Pitch (mm) | Chip Size (mmSQ) | The number of terminals under Chip | The maximum number of external terminals | Package Dimension (mm) |
| --- | --- | --- | --- | --- |
| 0.5 | 1 | 4 | 16 | 2.5 |
| 0.5 | 2 | 16 | 36 | 3.5 |
| 0.5 | 3 | 36 | 64 | 4.5 |

TABLE 1-continued

| Pitch (mm) | Chip Size (mmSQ) | The number of terminals under Chip | The maximum number of external terminals | Package Dimension (mm) |
|---|---|---|---|---|
| 0.5 | 4 | 64 | 100 | 5.5 |
| 0.5 | 5 | 100 | 144 | 6.5 |
| 0.5 | 6 | 144 | 196 | 7.5 |
| 0.5 | 7 | 196 | 256 | 8.5 |

"Pitch" in Table 1 means a distance between two adjacent posts and it is measured from the center of one post to the center of the other post. As shown in Table 1 above, the pitch is for example about 0.5 mm. "Chip size" is a chip size of the IC element sealed in the resin package. The maximum number of the external terminals is the largest number of the posts 40 which can be sealed with resin as a resin package. "Package dimension" is a lengthwise length or a crosswise length of the resin package when viewed in plan. Note that the examples in Table 1 are the case where the IC element and the resin package have a square shape when they are viewed in plan.

According to the first embodiment described above, the post 40 can be used as the die pad on which the IC element 51 is mounted or used as the external terminal of the IC element 51. Therefore the post 40 can be changed into the die pad or the external terminal depending on a shape and size of the IC fixing area. In other words, the post 40 can serve as either the die pad or the external terminal. Thereby it is not necessary to prepare a specific die pad, lead frame and substrate (interposer or the like) which are especially made depending on a type of the IC element 51 in order to build a semiconductor device like the hitherto known technique required. This means that a single type of the substrate 50 that is used for mounting an element and an external terminal can be adopted for various types of the IC element 51 because the substrate can accommodate various layouts of the pad terminals of the IC element. In this way, it is possible to reduce the manufacturing cost of the semiconductor device.

Moreover, according to the first embodiment, even after the IC element 51 is fixed on the upper faces of the posts 40 and is sealed with the mold resin 61, each column of the posts 40 can be recognized by using the mark 43, and each row of the posts can be recognized by using the mark 44 from the lower face side of the mold resin 61. Thereby a fiducial point used for deciding a dicing line can be made clear even though the posts 40 have the same figure and size in the substrate 50. In this way, it is possible to increase accuracy and efficiency in the dicing process.

In the first embodiment, the post 40 exemplarily corresponds to a "metal post", the mark 43 exemplarily corresponds to a "first mark" and the mark 44 exemplarily corresponds to a "second mark" in the invention defined by the claims laid out herein. Moreover, the gold wire 53 exemplarily corresponds to a "conductive part" and the mold resin 61 exemplarily corresponds to "resin".

Figure 10B:
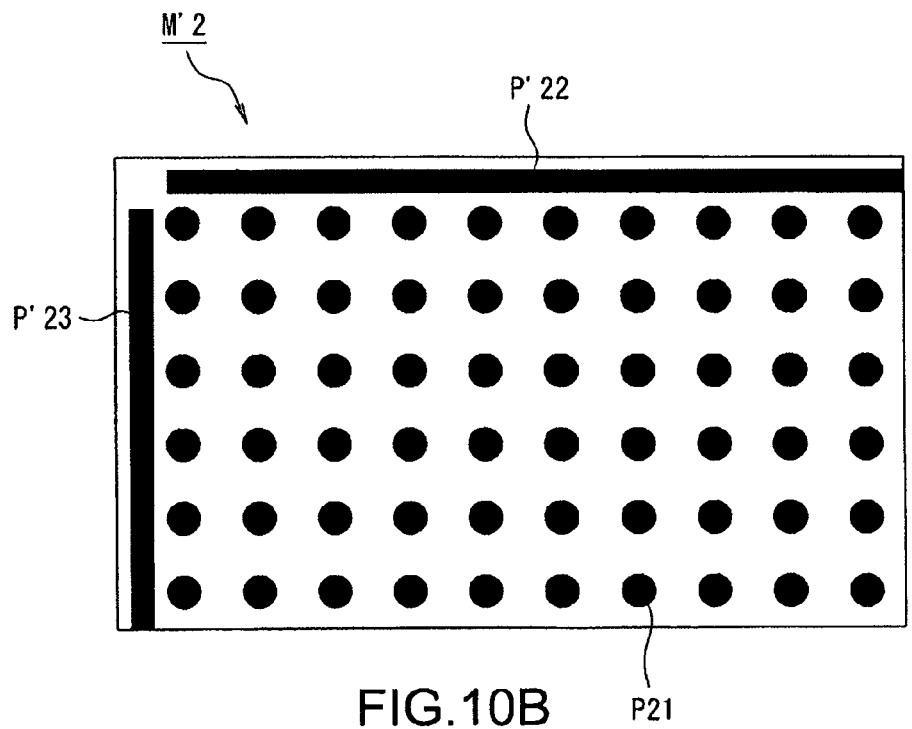

Though the photomask M2 shown in FIG. 10A is used in the above-described first embodiment, a photomask M2' shown in FIG. 10B can be used instead, and the resist pattern 31 (for example see FIG. 7) can be formed on the upper face of the copper plate 1 by using the photomask M2'. The photomask M2' has light shielding patterns P'22 and P'23 that have a unbroken pattern in the peripheral area of the mask, which is different from the photomask M2. Thereby a resist is left in a continuous pattern on the upper face of the copper plate 1 in the area corresponding to the unbroken light shielding patterns.

Figure 8B:
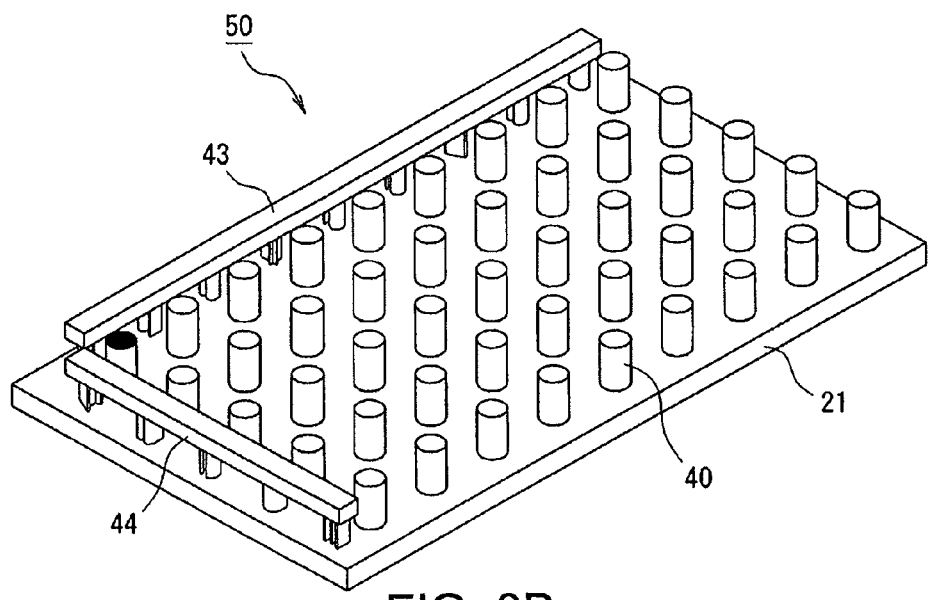

Consequently, the marks 43, 44 having a number or character figure are formed only in the area close to the supporting substrate 21 for example as shown in FIG. 8B. Even with such configuration, the marks 43, 44 are exposed from the lower face of the mold resin 61 after the resin sealing step, and it is possible to recognize each column and row of the posts 40 by using the marks 43, 44 as a guide. Therefore, in the same way as the above-described first embodiment, a fiducial point for deciding a dicing line of the mold resin 61 can be made clear in the substrate 50 and it is possible to increase accuracy and efficiency in the dicing process.

Figure 18A:
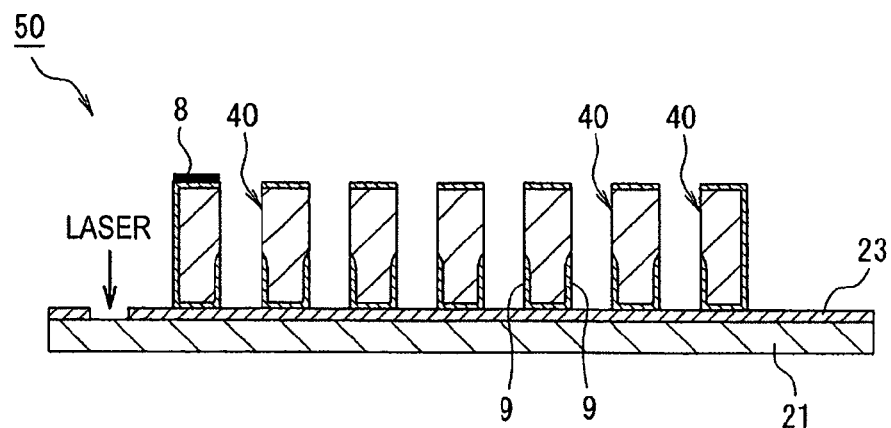
FIG. 18 is a first drawing showing another method for manufacturing the semiconductor device 100.
Figure 18B:
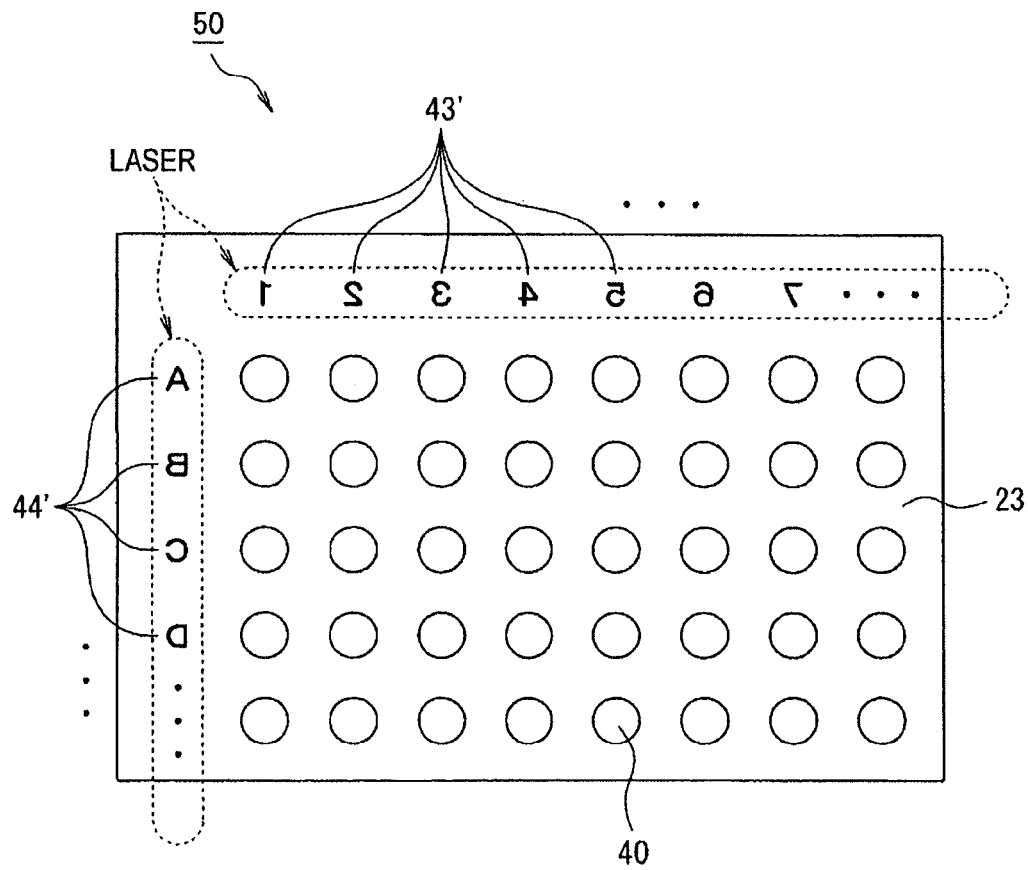

Moreover, the marks 43, 44 are formed by etching the copper plate 1 in the above-described first embodiment. However a method for providing the marks 43, 44 is not limited to this. For example, after the plurality of the posts 40 is formed on the supporting substrate 21 as shown in FIG. 7C, the adhesive 23 on the supporting substrate 21 can be irradiated with laser so as to form a mark 43' and a mark 44', which are concave portions as illustrated by FIGS. 18A and 18B. In this case, the mark 43' preferably have a pattern of for example an mirrored images of numbers 1, 2, 3, 4, . . . and the mark 44' preferably have a pattern of for example an mirrored images of characters A, B, C, D, . . . .

Figure 19:
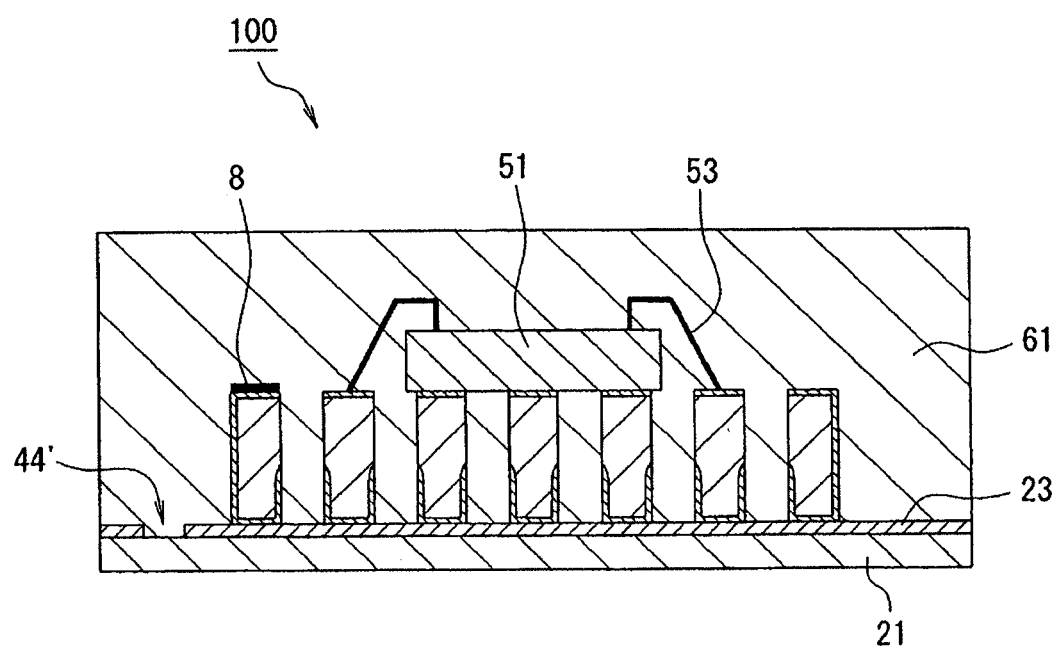
FIG. 19 is a second drawing showing another method for manufacturing the semiconductor device 100.

In this method, for example, the concave portion of the mark 44' is filled with the mold resin 61 in the resin sealing step as illustrated in FIG. 19. The mark 44 that has a convex shape corresponding to the concave portion is formed for example as illustrated in FIG. 15. At this point, in case of the mark 44' having the mirror character, the mark 44 is formed as it is recognized to have a normal character pattern. Though it is not shown in FIG. 19, the concave portion of the mark 43' is also filled with the mold resin 61 in the resin sealing step. The mark 43 having a convex shape corresponding to the concave portion is formed for example as illustrated in FIG. 15. At this point, in case of the mark 43' having the mirror number, the mark 43 is formed as it is recognized to have a normal number pattern. Since the marks 43, 44 that have convex shapes and are made of the mold resin 61 are provided, it is possible to distinguish each column and row of the plurality of the posts 40 by using the marks as a guide, which means the same advantageous effects as those of the first embodiment can be obtained.

Moreover, though the photoresist formed on the upper face and the lower face of the copper plate 1 are a positive type in the above-described first embodiment, the photo resists can be a negative type. If a negative type photoresist is adopted, the shielding patterns P11, P12, P13, P21, P22, P23, P'22, P'23 and the transmissive area through which light is transmitted are inverted in the photomask M1 which is exemplarily illustrated in FIG. 9 and in the photomasks M2, M2' which are exemplarily illustrated in FIG. 10A and FIG. 10B respectively. In other words, an inverted mask of the photomask M1, and inverted masks of the photomasks M2, M2' are used. In this way, the resist patterns 5, 31 (for example, see FIG. 2 and FIG. 7) having the same pattern as that of the first embodiment can be formed.

Second Embodiment

In the above first embodiment, the lower face of the copper plate 1 is adhesively bonded to the upper face of the supporting substrate 21, and the substrate 50 including the post 40 and the marks 43, 44 is fabricated. The method for manufacturing the substrate and the semiconductor device thereof according to an aspect of the invention is not limited to the method described in the first embodiment but can be embodied in other ways for example as the hereunder described second embodiment of the invention.

In the following second embodiment description, a method for manufacturing the substrate is firstly explained, then a method for manufacturing the semiconductor device equipped with the substrate will be described. As an example of the method for manufacturing the substrate, two different methods will be described with reference to FIG. 21 and FIG. 22 in the following second embodiment. FIG. 21 shows a manufacturing method that applies a semi-additive method, and FIG. 22 shows a manufacturing method that applies a subtractive method. After these two methods are described, a method for manufacturing the semiconductor device will be explained with reference to FIG. 24 and FIG. 25.

Figure 21A:
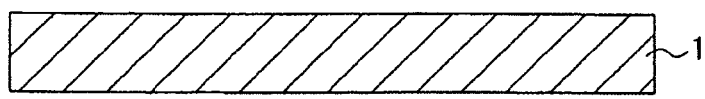
FIG. 21 is a first drawing showing a method for manufacturing a substrate 150 according to a second embodiment of the invention.
Figure 21B:
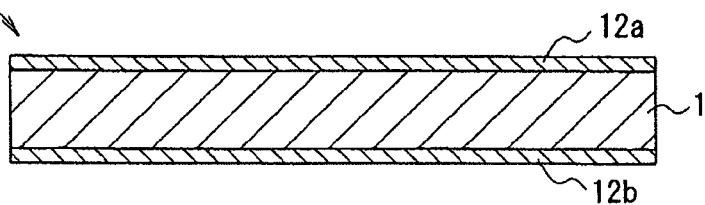

FIGS. 21A through 21F are sectional views of a substrate 150 showing a method (the semi-additive method) for manufacturing the substrate 150 according to the second embodiment. Referring to FIG. 21A, the copper plate 1 is provided. Referring to FIG. 21B, photoresists 12a, 12b are applied on the upper face and lower face of the copper plate 1 respectively. The photoresists 12a, 12b can be either a positive type or a negative type.

Figure 21C:
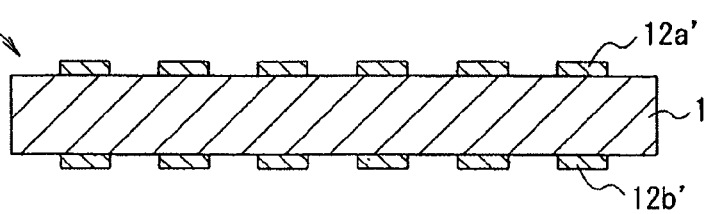

Referring to FIG. 21C, the photoresists are exposed and developed, and an area where a cylindrical electrode (or a post) 40 which is provided in the plural number is formed and an area where the marks 43, 44 for recognizing a column and row of the posts are formed are exposed. Resist pattern 12a', 12b' are also formed in other area than the above mentioned areas. The resist pattern 12a' is provided on the upper face of the copper plate 1 and the resist pattern 12b' is provided on the lower face of the copper plate 1. When the photoresists 12a, 12b are for example a negative type, the photomask M2 shown in FIG. 10A can be for example used to expose the photoresist 12a, and the photomask M1 shown in FIG. 9 can be for example used to expose the photoresist 12b. When the photoresists 12a, 12b are a positive type, an inverted mask of the photomask M2 can be for example used to expose the photoresist 12a, and an inverted mask of the photomask M1 can be for example used to expose the photoresist 12b.

Figure 21D:
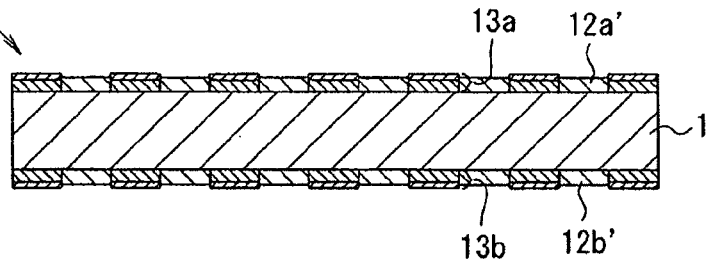

Referring to FIG. 21D, plated layers 13a, 13b are formed on the copper plate 1 in an area where is exposed from the resist patterns 12a', 12b' (in other words, an area where the post is formed) by for example using an electroplating method. The plated layer 13a is formed on the upper face of the copper plate 1 and the plated layer 13b is formed on the lower face of the copper plate 1.

Though the plated layers 13a, 13b shown in FIG. 21D have a double layered structure, the plated layers 13a, 13b can have a multi-layered structure or a single-layer structure. For instance, the plated layers 13a, 13b can have a triple-layered structure of Ni (a bottom layer)/Pd (a mid layer)/Au (a top layer), a double layered structure of Ni (a bottom layer)/Au (a top layer), or a single layer structure of Ag.

Figure 21E:
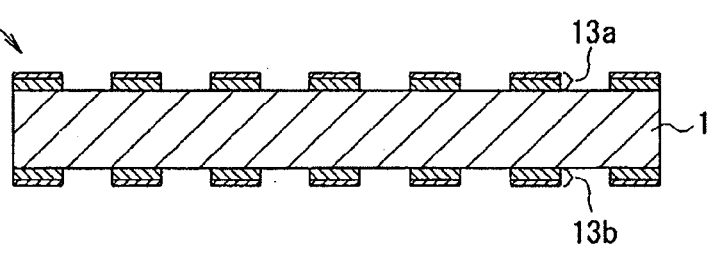
Figure 21F:
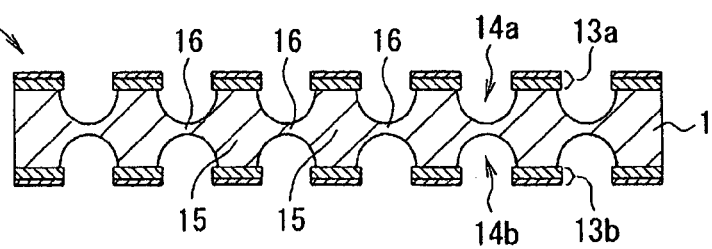

Referring to FIG. 21E, the resist patterns are removed from the upper face and lower face of the copper plate 1. Referring to FIG. 21F, the copper plate 1 is then etched from its upper face side by using the plated layer 13a as a mask and a concave portion 14a is formed. At the same time, the lower face side of the copper plate 1 is also etched by using the plated layer 13b as a mask so as to form a concave portion 14b. A post 15 which is provided in the plural number is formed by half-etching the copper plate 1 from its upper face side and its lower face side. A connecting part 16 that couples the posts 15 in the crosswise direction when viewed in section is also formed. More specifically, an etching process is stopped before parts of the copper plate 1 existing between the posts 15 completely disappear (are penetrated) by the etching. Through this half-etching process, the substrate 150 having the posts that are coupled each other with the part that exists at some point from the upper face to the lower face of the copper plate 1 is completed.

The above half-etching process of the copper plate 1 described with reference to FIG. 21F is conducted for example by wet-etching that adopts a dipping method or a spraying method. As an etching solution, a ferric dichloride solution or an alkaline etching solution (hereinafter referred as an alkaline solution) is for example used.

Depths of the concave portions 14a, 14b that are formed on the upper face and the lower face of the copper plate 1 respectively can be made same or different. When the concave portions 14a, 14b are for example formed by the wet-etching adopting a spraying method, a treating time for etching the upper face side is set twice longer than a treating time of the lower face side. In this way, the concave portion 14a having a depth of for example 0.1 mm is formed on the upper face side and the concave portion 14b having a depth of for example 0.05 mm is formed on the lower face side.

Referring to FIG. 21E, a photoresist (not shown in the drawing) for protecting the plating can be further provided on the upper face and the lower face of the copper plate 1 before the copper plate is etched. In this case, the copper plate 1 is etched by using the plated layers 13a, 13b that are covered with the photoresist as a mask in the etching process of the copper plate 1 thereby it is possible to protect the plated layers 13a, 13b from an etching solution.

This photoresist for protecting the plated layers can remain even after the concave portions 14a, 14b have been formed. In this way, it is possible to keep protecting the plated layers 13a, 13b in assembling processes that are subsequently performed. The plated layer protection photoresist can be left on both of the plated layers 13a, 13b or only on the plated layer 13b. When the protection photoresist only remains on the plated layer 13b, it is possible to keep protecting the plated layer 13b in the subsequently performed assembling processes. Furthermore, the photoresist for protecting the plated layer can be provided not before but after the copper plate 1 is etched. Even in this case, it is possible to keep protecting the plated layers 13a, 13b in the assembling processes that are subsequently performed.

Another method for manufacturing the substrate will be now described with reference to FIG. 22.

FIGS. 22A through 22G are sectional views of the substrate 150 showing a method for manufacturing the substrate 150 according to the second embodiment (the subtractive method). In FIG. 22, the identical numerals are given to the same structures and parts as those shown in FIG. 21 and those explanations will be omitted.

Referring to FIG. 22A, the copper plate 1 is firstly provided. Referring to FIG. 22B, the plated layers 13a, 13b are subsequently formed on the upper face and lower face of the copper plate 1 respectively by for example electroplating. In the same manner as the above configuration described with reference to FIG. 21, though the plated layers 13a', 13b' shown in FIG. 22B have a double layered structure, the plated layers 13a', 13b' can have a multi-layered structure or a single-layer structure. For instance, the plated layers 13a', 13b' can have a multi-layered structure of Ni (a bottom layer)/Pd (a mid layer)/Au (a top layer), a multi-layered structure of Ni (a bottom layer)/Au (a top layer), or a single layer structure of Ag.

Referring to FIG. 22C, photoresists 17a, 17b are applied on the upper face and lower face of the copper plate 1 respectively. The photoresists 17a, 17b can be either a positive type or a negative type. Referring to FIG. 22D, the photoresists 17a, 17b are exposed and developed so as to form resist pattern 17a', 17b' that cover the area where posts are disposed and the area where the marks 43, 44 for recognizing each column and row of the posts are disposed. Areas other than the above-stated areas are exposed from the resist patterns 17a', 17b'.

The resist pattern 17a' is provided on the upper face of the copper plate 1 and the resist pattern 17b' is provided on the lower face of the copper plate 1. When the photoresists 17a, 17b are for example a positive type, the photomask M2 shown in FIG. 10A can be for example used to expose the photoresist 17a, and the photomask M1 shown in FIG. 9 can be for example used to expose the photoresist 17b. When the photoresists 17a, 17b are a negative type, an inverted mask of the photomask M2 can be for example used to expose the photoresist 17a, and an inverted mask of the photomask M1 can be for example used to expose the photoresist 17b.

The plated layers 13a', 13b' are then etched and removed by using the resist patterns 17a', 17b' as a mask. In this way, the plated layers 13a, 13b that have been patterned are provided on the upper face and lower face of the copper plate 1 respectively as shown in FIG. 22E.

When the plated layers 13a, 13b have a multi-layered structure of for example Ni/Pd/Au or Ni/Au, aqua regia is for example used as an etching solution for the plated layers. When the plated layers 13a, 13b are made of for example Ag, a nitric acid solution is for example used as the etching solution. After etching the plated layers, referring to FIG. 22F, the upper face and lower face of the copper plate 1 is etched by using the resist patterns 17a', 17b' and the plated layers 13a, 13b which are covered with the resist patterns as a mask. In this way, a concave portion 14a is formed on the upper face side of the copper plate 1, and a concave portion 14b is formed on the lower face side of the copper plate.

In the same manner as the above manufacturing method described with reference to FIG. 21, the manufacturing method illustrate in FIG. 22 also form the posts 15 by half-etching the copper plate 1 from its upper face side and its lower face side. The connecting part 16 that couples the posts 15 each other in the crosswise direction when viewed in section is also formed. More specifically, the etching process is stopped before the part of the copper plate 1 existing between the posts 15 completely disappear (is penetrated) by the etching. Through this half-etching process, the substrate 150 having the posts 15 that are coupled with a part that exists at some point from the upper face to the lower face of the copper plate 1 is completed.

The above half-etching process of the copper plate 1 described with reference to FIG. 22F is conducted for example by wet-etching adopting a dipping method or a spraying method. As an etching solution, a ferric dichloride solution or an alkaline solution is for example used. Depths of the concave portions 14a, 14b that are formed on the upper face and the lower face of the copper plate 1 respectively can be made same or different. When the concave portions 14a, 14b are for example formed by the wet-etching adopting a spraying method, the concave portion provided on the upper face side can have a depth of for example 0.1 mm and the concave portion provided on the lower face side can have a depth of for example 0.05 mm by adjusting the treating time of the wet-etching in the same manner as the above manufacturing method described with reference to FIG. 21.

Referring to FIG. 22G, the resist patterns are removed from the substrate 150. This resist pattern removal step is not an essential step in this embodiment. In other words, the resist pattern can remain on the both sides of the substrate 150. Moreover, only the resist pattern disposed on the upper face side of the substrate 150 can be removed and the resist pattern disposed on the lower face side can be left as it is in the step illustrated in FIG. 22G. In this way, the resist patterns can be used as protection films for the plated layer 13a and the plated layer 13b in subsequently performed assembling steps.

In the above manufacturing method described with reference to FIG. 22, the steps illustrated in FIGS. 22C through 22E can be conducted by a physical process instead of a chemical process such as wet-etching. For instance, the plated layers 13a, 13b can be partially removed by a sandblast treatment or a treatment using a cutting instrument. The sandblast treatment is a process in which the plated layers 13a, 13b are scraped off by locally blasting for example glass particles. By adjusting the amount of the glass particles blasted, a blasting pressure and the like, it is possible to process the plated layers 13a, 13b as shown in FIG. 22E.

Figure 23A:
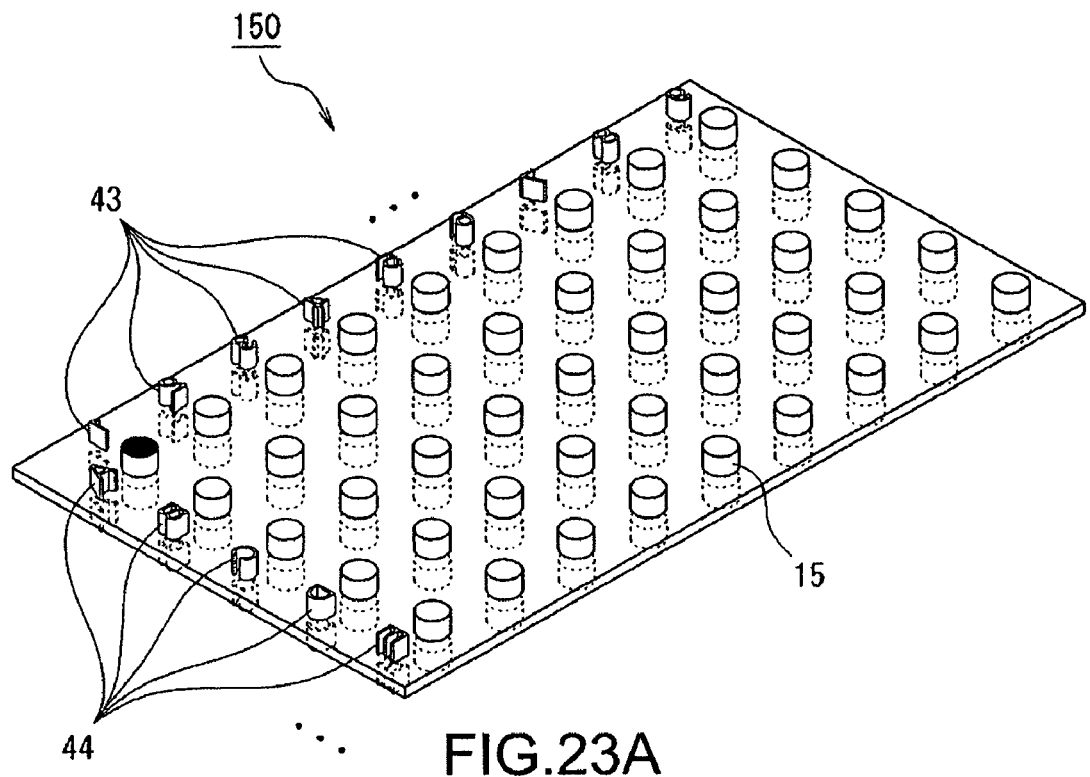
FIG. 23 illustrates an example of the substrate 150 according to the second embodiment.

FIG. 23A shows another example of the substrate 150. The substrate 150 which is manufactured by the method described with reference to FIGS. 21A through 21F has the same structure as that of the substrate 150 which is manufactured by the method described with reference to FIGS. 22A through 22G. An example of the configuration of the substrate in three dimension is given in FIG. 23A. More specifically, the substrate 150 has the posts 15 that are arranged in the lengthwise and crosswise directions and are coupled each other with parts which exist at some part (for example a mid part in a thickness direction) between the upper face and the lower face. The mark 43 having for example a number (a mirror number when viewed from the upper face side) pattern is provided on the extended line of each column of the posts 15 arranged in the lengthwise direction. The mark 44 having for example a character (a mirror character when viewed from the upper face side) pattern is provided on the extended line of each row of the posts 15 arranged in the crosswise direction. The marks 43, 44 also have the coupling structure such that marks are coupled each other with the post 15 at the mid point in the thickness direction of the marks.

After the substrate 150 is completed, the recognition mark 8 is formed by coloring the upper face (front face) of the post 15 that is located at a predetermined position by for example an ink jet method or a laser marking method. When the recognition mark 8 is provided by the ink jet method, a heat resistant multicolor ink, a multi color plating material or the like can be used as a coloring material.

A method for manufacturing a semiconductor device by installing a bare IC element on the substrate 150 will be now described.

Figure 24A:
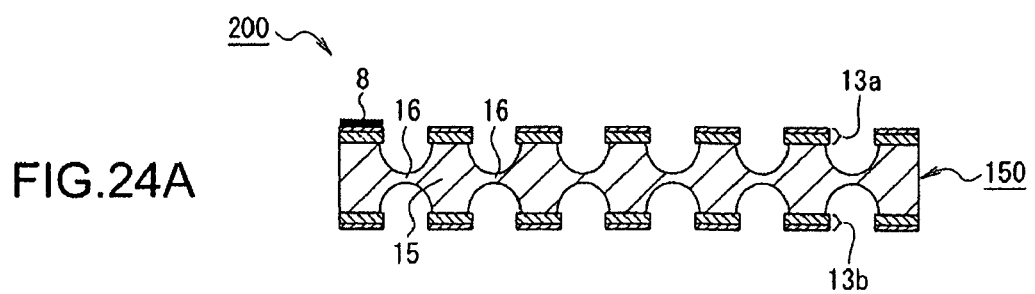
FIG. 24 is a first drawing showing a method for manufacturing a semiconductor device 200 according to the second embodiment.
Figure 24B:
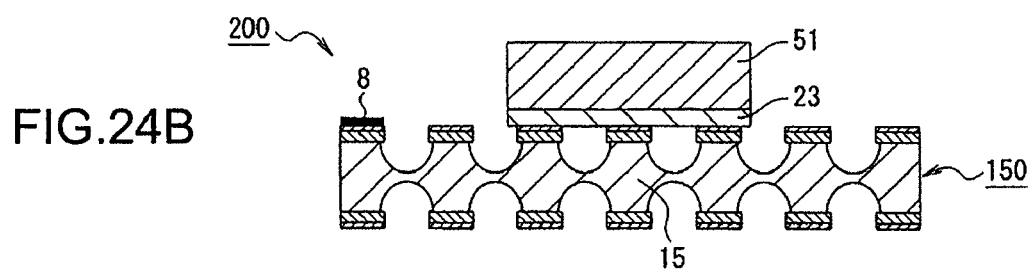

FIGS. 24A through 25B are sectional views of a semiconductor device 200 showing a method for manufacturing the semiconductor device 200 according to the second embodiment of the invention. Referring to FIG. 24A, the IC fixing area is identified by using the recognition mark 8 as a guide. The IC element 51 is then aligned and disposed in the identified IC fixing area. Referring to FIG. 24B, the IC element is then fixed onto the posts 15 that are located in the IC fixing area as the IC element is aligned (a die-attaching step). In this way, the IC element 51 can be accurately aligned in the IC fixing area and the IC element 51 can be mounted on the substrate 51 without causing misalignment or at least with a minimum displacement. In this die-attaching step, the IC element 51 and the post 15 are bonded with the adhesive 23. The adhesive 23 used here is for example a thermosetting paste or sheet.

Figure 24C:
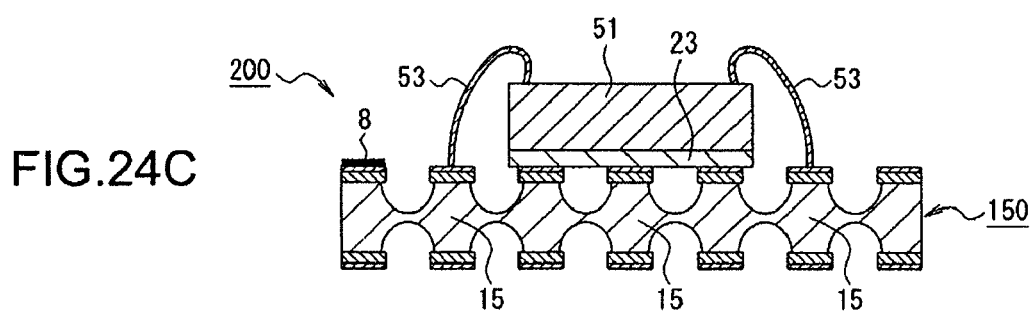

Referring to FIG. 24C, the upper face of the post 15 that is located in an area other than the IC fixing area (in other words, the area remote from the IC element 51) and the pad terminal that is disposed on an active face of the IC element 51 are coupled with for example a gold wire 53 (a wire-bonding step). At this point, the post 15 that serves as an external terminal can be identified by using the recognition mark 8 as a guide, and one end of the gold wire 53 can be coupled to the identified post 15.

Figure 24D:
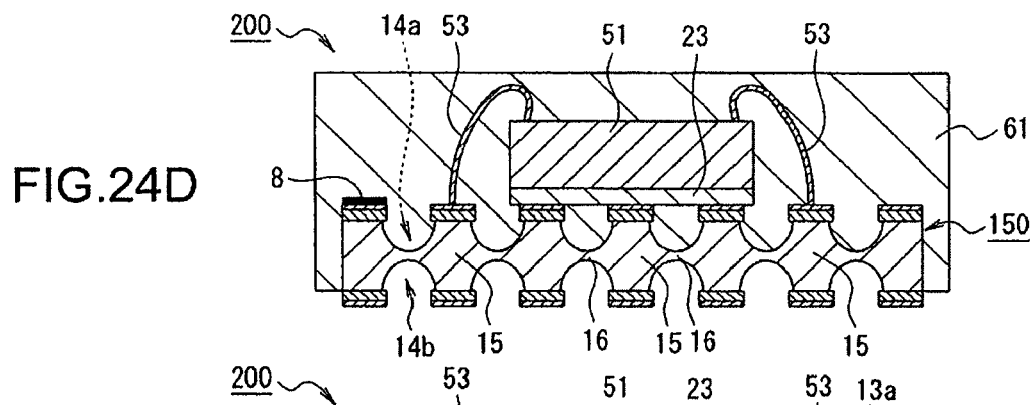

Referring to FIG. 24D, the upper face area of the substrate 150 including the IC element 51, the gold wire 53, the post 15 and the marks 43, 44 that are provided for recognizing each column and row of the posts 15 (for example see FIG. 23A) is blanket-sealed with the resin 61 (a resin sealing step). The mold resin 61 here is for example a thermosetting epoxy resin or the like. In this resin sealing step, a cavity is for example placed over the upper face side of the substrate 150 including the IC element and the like, the inside of the cavity is depressurized and the mold resin 61 is then supplied into the depressurized cavity. When the resin is supplied under a reduced pressure, the mold resin 61 can be efficiently provided into the cavity and it is possible to fill the concave portion 14a with the mold resin 61 without leaving a space in the concave portion as shown in FIG. 24D.

Figure 24E:
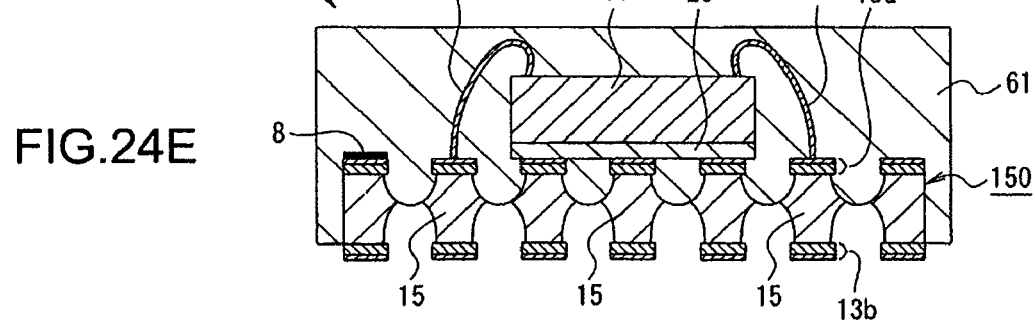
Figure 26A:
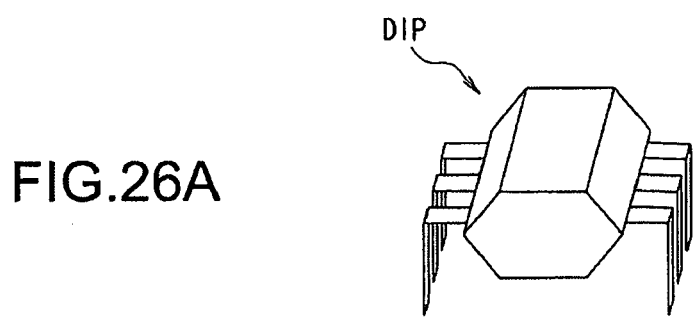
FIG. 26 illustrates an example of related art.
Figure 26B:
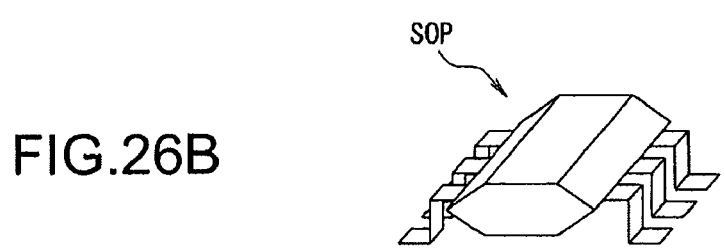
Figure 26C:
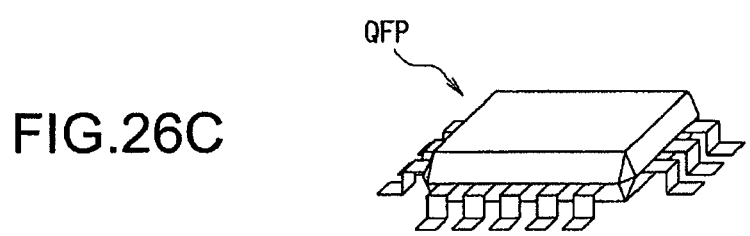
Figure 26D:
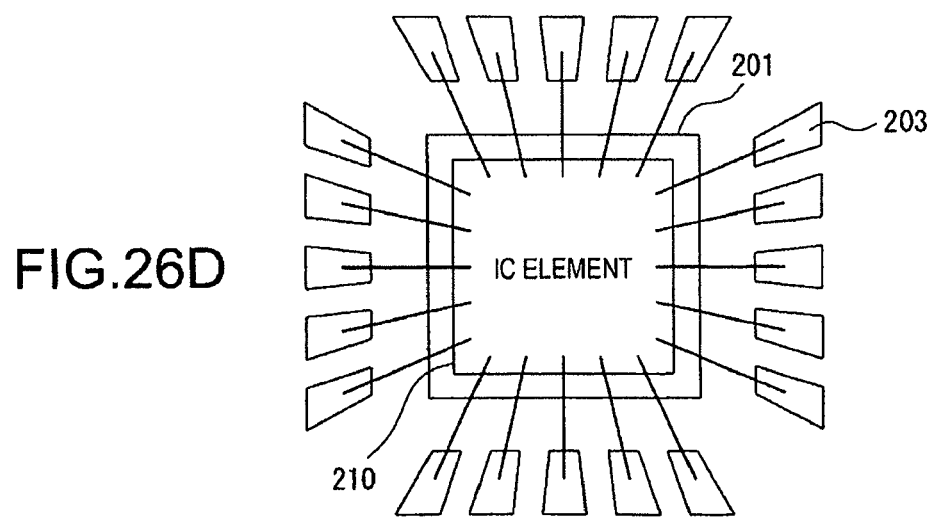
Figure 27A:
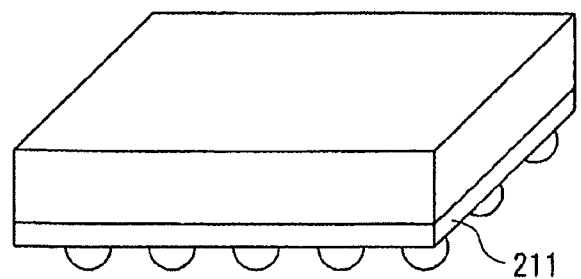
FIG. 27 illustrates an example of related art.
Figure 27B:
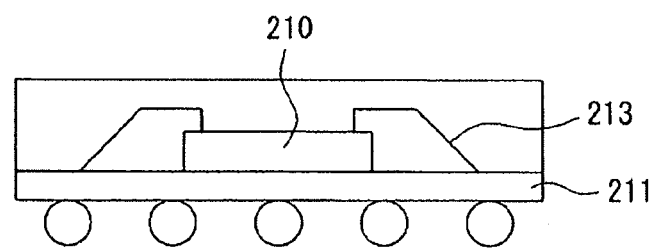
Figure 28A:
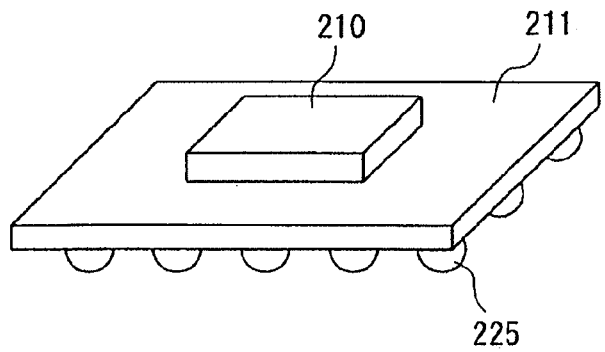
FIG. 28 illustrates an example of related art.
Figure 28B:
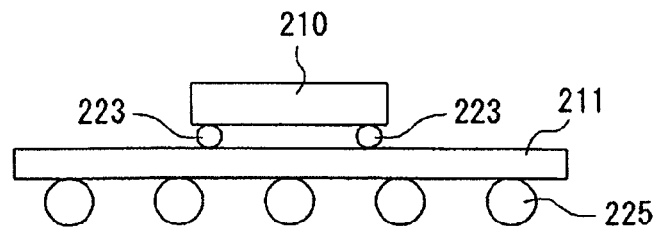
Figure 29A:
FIG. 29 illustrates an example of related art.
Figure 29B:
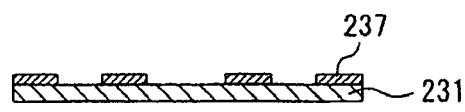
Figure 29C:
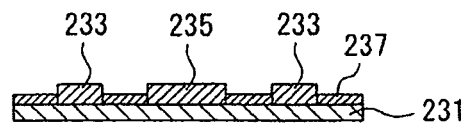
Figure 29D:
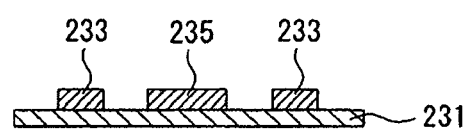
Figure 29E:
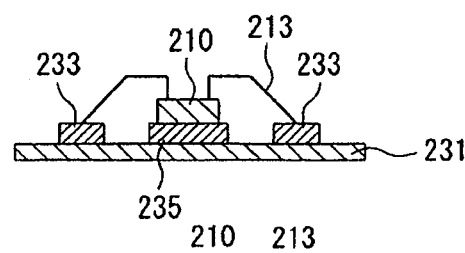
Figure 29F:
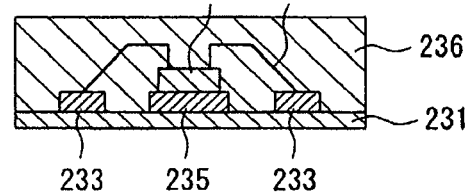
Figure 29G:
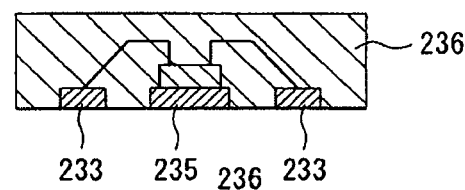
Figure 29H:
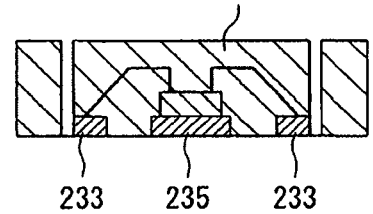
Figure 29I:
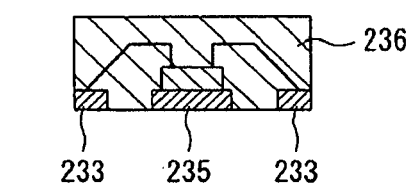

The connecting part 16 that couples the posts 15 is then removed by etching from the lower face side. The etching of the connecting part 16 is performed by using a ferric dichloride solution or an alkaline solution which is also used in the formation of the concave portions 14a, 14b. Referring to FIG. 24E, the two adjacent posts 15 are electrically separated, and the individual post 15 that is coupled to the gold wire 53 can be used as an electrically independent external terminal. Furthermore, the upper face part of each post 15 is fixed with the mold resin 61 thereby the position of the post 15 is retained even after the connecting part is removed.

When an unshown photoresist is left as the protection film for the plated layer 13b on the lower face side, the photoresist is removed after the connecting part of the photoresist is removed. Moreover, when the plated layer 13b is formed by Ag plating, the Ag plate can be removed and other types of plating can be further conducted. In other words, the Ag plate is removed and then a different type of plating can be performed to provide the new plated layer 13b. The other types of plating encompass for example Ni/Pd/Au, Ni/Au and solder. This reset of the plated layer 13b is performed after the photoresist is removed when the photoresist is provided on the lower face side, or after the connecting part is removed when the photoresist is not provided on the lower face side.

Referring to FIGS. 25A and 25B, the dicing blade 75 cuts the mold resin 61 according to the outer shape of the product (a dicing step). In this dicing step, the mold resin 61 is diced into each resin package and unnecessary parts of the resin which cannot become a product is cut out and removed. Referring to FIG. 15, for example, the mark 43 having a number pattern and the mark 44 having a character pattern are exposed from the lower face of the mold resin 61 during the dicing step, thereby the mold resin 61 is diced by using the marks 43, 44 as a guide. More specific description of the dicing step has been described above in the first embodiment.

Furthermore, in the dicing step, the terminal part (or the post 15) can be cut with the dicing blade 75 whose size is larger than the size of the terminal as shown in FIG. 25A, or the part between the terminals (in other words between the two adjacent posts 15) can be cut with the dicing blade 75 whose size is smaller than a half-etching width size as shown in FIG. 25B. Referring to FIG. 25A, the post 15 on which the recognition mark 8 is formed can be cut out. Through the above-described steps, the semiconductor device 200 is completed.

Though the dicing is conducted without providing the UV tape or the like on the whole upper face of the mold resin 61 in the second embodiment which is described above with reference to FIGS. 25A and 25B, this is only an example. In the same manner as the first embodiment, the UV tape can be provided on the whole upper face of the mold resin 61 and then the dicing can be performed in the second embodiment. In this case, as described in the first embodiment, the dicing blade 75 is applied on the face of the mold resin 61 where the UV tape is not provided and the mold resin 61 is cut according to the shape of a product.

According to the second embodiment described above, the post 15 which is the provided in the plural number can be used as the die pad on which the IC element 51 is mounted or used as the external terminal of the IC element 51. Therefore a desired number of the posts 15 can be changed into the die pads or the external terminals depending on a shape and size of the IC fixing area. Thereby it is not necessary to prepare a specific die pad, a specific lead frame and a specific substrate 150 (interposer or the like) which are especially made depending on a type of the IC element 51 in order to build the semiconductor device 200. This means that a single type of the substrate 150 that is used for mounting an element and an external terminal can be adopted for various types of the IC element 51 because the substrate can accommodate various layouts (arrangements) of the pad terminals of the IC element. In this way, it is possible to reduce the manufacturing cost of the semiconductor device.

Moreover, according to the second embodiment, even after the IC element 51 is fixed on the upper faces of the posts 15 and is sealed with the mold resin 61, each column of the posts 15 arranged in the lengthwise direction can be recognized by using the mark 43, and each row of the posts arranged in the crosswise direction can be recognized by using the mark 44 from the lower face side of the mold resin 61. Thereby a fiducial point for deciding a dicing line can be made clear even though the posts 15 have the same figure and size in the substrate 150. In this way, it is possible to increase accuracy and efficiency in the dicing process.

Figure 23B:
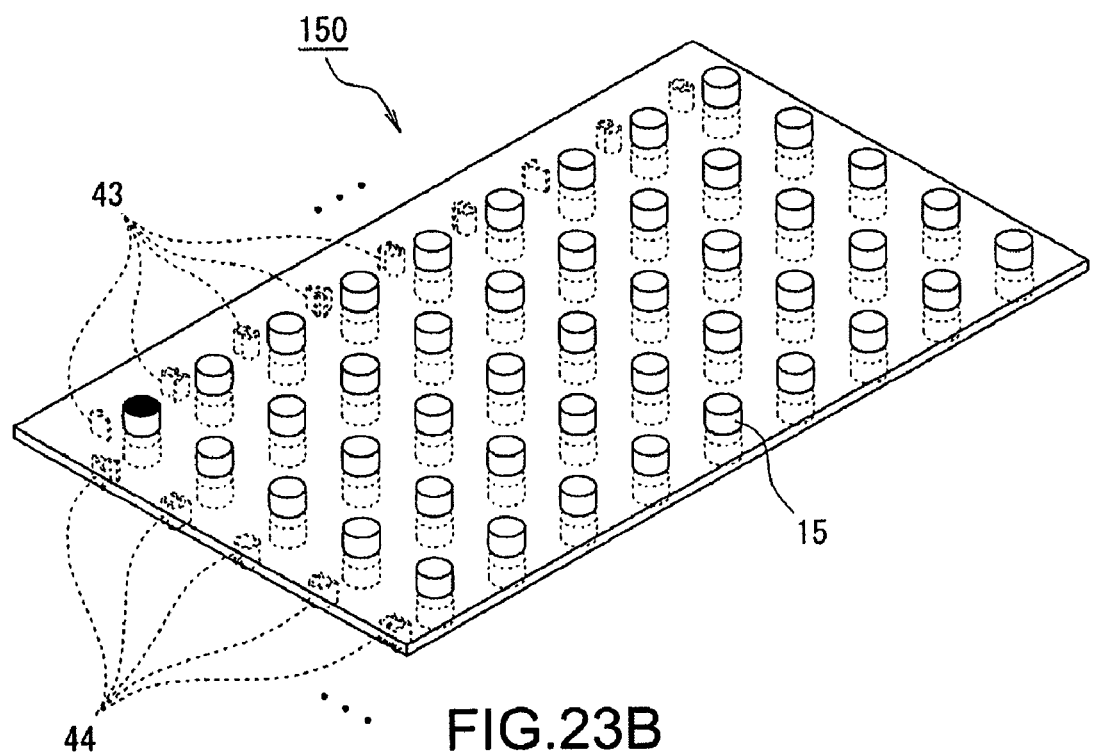

In the above described second embodiment, the marks 43, 44 are formed on both the lower face and upper face of the substrate 150, which is described for example with reference to FIG. 23A. However, the marks 43, 44 that have a mirror number pattern and a mirror character pattern are not necessarily provided on the upper face of the substrate 150. In other words, the marks 43, 44 can be provided only on the lower face of the substrate 150 as shown in FIG. 23B. Even in this case, the marks 43, 44 (which are provided on the lower face of the substrate 150) are exposed from the lower face of the mold resin after the resin sealing step so that it is possible to recognize each column and row of the posts 15.

In order to obtain the substrate 150 shown in FIG. 23B, a mask having a pattern in which the light shielding patterns P22, P23 are removed from the photomask M2 (in other words the photomask M2 that does not have the light shielding patterns P22, P23 and the area where the patterns existed is made optically transparent) can be used to expose the negative type resist pattern 12a or the positive type resist pattern 17a.

Figure 20:
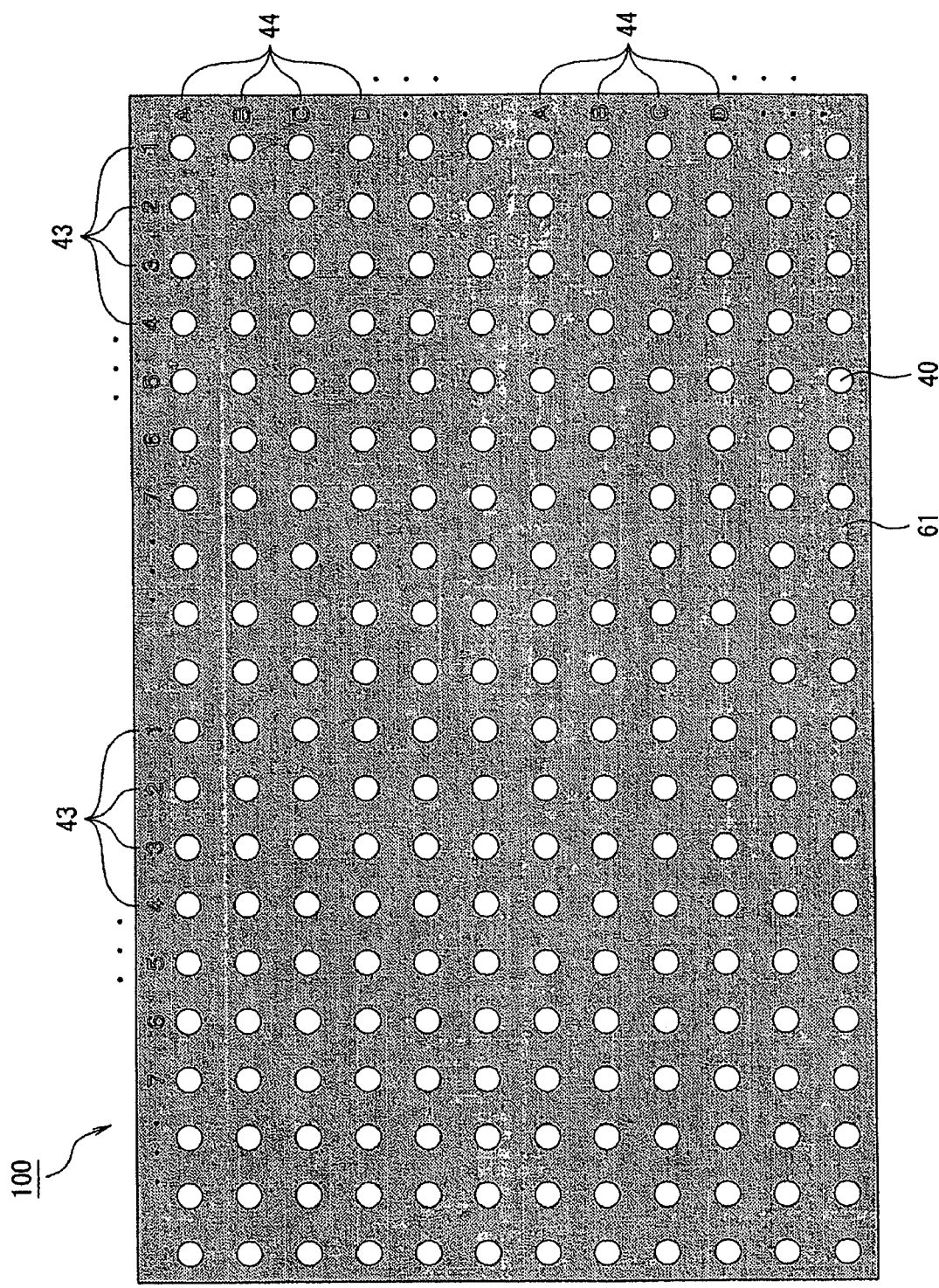
FIG. 20 is a third drawing showing another method for manufacturing the semiconductor device 100.

Though the marks 43, 44 have the pattern in which a different number and character is disposed at each column and row in the above described first and second embodiments, the invention is not limited to this. For instance, the mark 43 can have a pattern in which numbers 1 to 9 are regularly repeated as shown in FIG. 20. In the same way, the mark 44 can have a pattern in which characters A to Z are regularly repeated. With such pattern, it is also possible to recognize each column and row in the same manner as the first embodiment.

Moreover, though the lower face (the face opposing the face where the pad terminal is provided) of the IC element is fixed so as to oppose the posts 40, and the pad terminal of the IC element and the post 40 are coupled with the gold wire 53 in the above-described first and second embodiments, the invention is not limited to this. For example, the IC element is placed such that the face on which the pad terminal is formed opposes the post 40, and the pad terminal and the post 40 are coupled through a bump which is provided on the pad terminal. In this case, the bump can be a stud bump, a solder bump, an Au bump that is formed by electroplating or the like.

Though the mark 43 has the number pattern such as 1, 2, 3, 4, . . . and the like and the mark 44 has the character pattern such as A, B, C, D, . . . and the like in the above-described first and second embodiments, the invention is not limited to this. For example, the mark 43 can have the character pattern and the mark 44 can have the number pattern. The number pattern is not limited to Arabic numerals such as 1, 2, 3, 4, . . . but can be Roman numerals such as I, II, III, IV, . . . and the like. The character pattern is not limited to capital alphabet letters such as A, B, C, D, . . . but can be lower-case alphabet letters such as a, b, c, d, . . . , Greek alphabet letters such as α, β, γ, δ, . . . , or the like. Moreover, the marks 43, 44 in the embodiments encompass other types of numbers, characters, symbols and the like.

What is claimed is:

1. A substrate on which an IC element is fixed, comprising:
a plurality of metal posts arranged in a plurality of columns in a lengthwise direction and in a plurality of rows in a crosswise direction when viewed in a plan view, the plurality of metal posts having first faces and second faces that face an opposite side to a side that the first faces face;
first marks, each of the first marks being disposed on each of extending lines of the plurality of columns; and
second marks, each of the second marks being disposed on each of extending lines of the plurality of rows.

2. The substrate according to claim 1, further comprising:
a supporting substrate supporting the second faces of the metal posts, the metal posts being bonded to the supporting substrate with adhesive.

3. The substrate according to claim 1, further comprising:
connecting parts connecting metal posts at parts between the first and second faces.

4. The substrate according to claim 1, wherein the metal posts have a same shape and a same size.

5. The substrate according to claim 1, wherein the first and the second marks are made of a same material as the metal posts are made of.

6. The substrate according to claim 2, wherein the first and the second marks are recessed portions formed in the adhesive.

7. The substrate according to claim 1, wherein the first and the second marks have a pattern of one of a number, a character and a symbol.

8. A method for manufacturing a substrate on which an IC element is fixed, comprising:

a) forming a plurality of metal posts that are arranged in a plurality of columns in a lengthwise direction and in a plurality of rows in a crosswise direction when viewed in a plan view, the plurality of metal posts having first faces and second faces that face an opposite side to a side which the first faces face;
b) forming first marks disposed on extending lines of the plurality of columns; and
c) forming second marks disposed on extending lines of the plurality of rows.

9. The method for manufacturing a substrate according to claim 8, wherein the forming of the plurality of metal posts includes:
bonding a second face of a metal plate to a supporting substrate with adhesive, the metal plate having a first face and the second face that faces an opposite side to a side which the first face faces; and
etching the bonded metal plate partially from the first face so as to form the plurality of the metal posts.

10. The method for manufacturing a substrate according to claim 8, wherein the forming of the plurality of metal posts includes:
forming the plurality of the metal posts and connecting parts that connect the metal posts by etching a metal plate partially at least from a first face of the metal plate, the metal plate having the first face and a second face that faces an opposite side to a side which the first face faces, and the connecting parts connecting the metal posts each other at parts between the first and the second faces.

11. A method for manufacturing a semiconductor device, comprising:
providing a substrate that has a plurality of metal posts, first marks and second marks, the plurality of metal posts arranged in a plurality of columns in a lengthwise direction and in a plurality of rows in a crosswise direction when viewed in a plan view, the plurality of metal posts having first faces and second faces that face an opposite side to a side which the first faces face, the plurality of metal posts including a first metal post and a second metal post, the first marks being disposed on extending lines of the plurality of columns, and the second marks disposed on extending lines of the plurality of rows;
fixing an IC element on the first face of the first metal post;
coupling the IC element and the first face of the second metal post electrically through a conducting part; and
sealing the IC element and the conducting part with resin, wherein in the sealing of the IC element, providing the resin onto the substrate in such a way that at least a part of the first marks and at least a part of the second marks appear on a surface of the resin.

12. The method for manufacturing a semiconductor device according to claim 11, further comprising:
dicing the resin by using the first and the second marks as a guide after the sealing.

* * * * *